(12) United States Patent
Ohashi et al.

(10) Patent No.: US 6,332,152 B1
(45) Date of Patent: Dec. 18, 2001

(54) ARITHMETIC UNIT AND DATA PROCESSING UNIT

(75) Inventors: Masahiro Ohashi; Mana Hamada; Tomonori Yonezawa; Shunichi Kurohmaru; Yasuo Kouhashi; Masatoshi Matsuo; Masayoshi Toujima, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/201,720

(22) Filed: Nov. 30, 1998

(30) Foreign Application Priority Data

Dec. 2, 1997 (JP) .................................................. 9-331417

(51) Int. Cl.$^7$ ............................... G06F 7/38; H03M 7/50
(52) U.S. Cl. .............................. 708/490; 341/63; 341/67
(58) Field of Search ........................ 708/490, 521, 708/524, 525, 495, 501, 505, 671; 341/59, 63, 67

(56) References Cited

U.S. PATENT DOCUMENTS

| | | |
|---|---|---|
| 3,935,379 | 1/1976 | Thornburg et al. . |
| 5,184,229 | 2/1993 | Saito et al. . |
| 5,210,713 | 5/1993 | Okabayashi . |
| 5,479,527 | 12/1995 | Chen . |
| 5,621,405 * | 4/1997 | Park et al. .............................. 341/67 |
| 5,710,561 * | 1/1998 | Schmidt et al. ....................... 341/63 |
| 6,026,191 * | 2/2000 | Ohara ................................... 382/232 |

FOREIGN PATENT DOCUMENTS 736739    2/1995   (JP) .

* cited by examiner

Primary Examiner—Chuong Dinh Ngo
(74) Attorney, Agent, or Firm—Stevens, Davis, Miller & Mosher, LLP

(57) ABSTRACT

For every data, the number of data matches that occurred consecutively is written to a memory together with non-matching data, and data from the memory is read out to continuously perform subsequent data processing and detect, at the same time, the last data written to the memory. To achieve this, a desired value is set in a data register, and a comparison instruction is issued by which the value set in the register is compared with a value set in a second register, and the number of matches that occurred consecutively is output together with nonmatching data; upon the output of a retrieval counter reaching a predetermined value, the comparison instruction is terminated, whereupon the number of consecutive matches, the nonmatching data, and an end flag signal are written to the memory at the same address.

2 Claims, 17 Drawing Sheets

F I G. 1
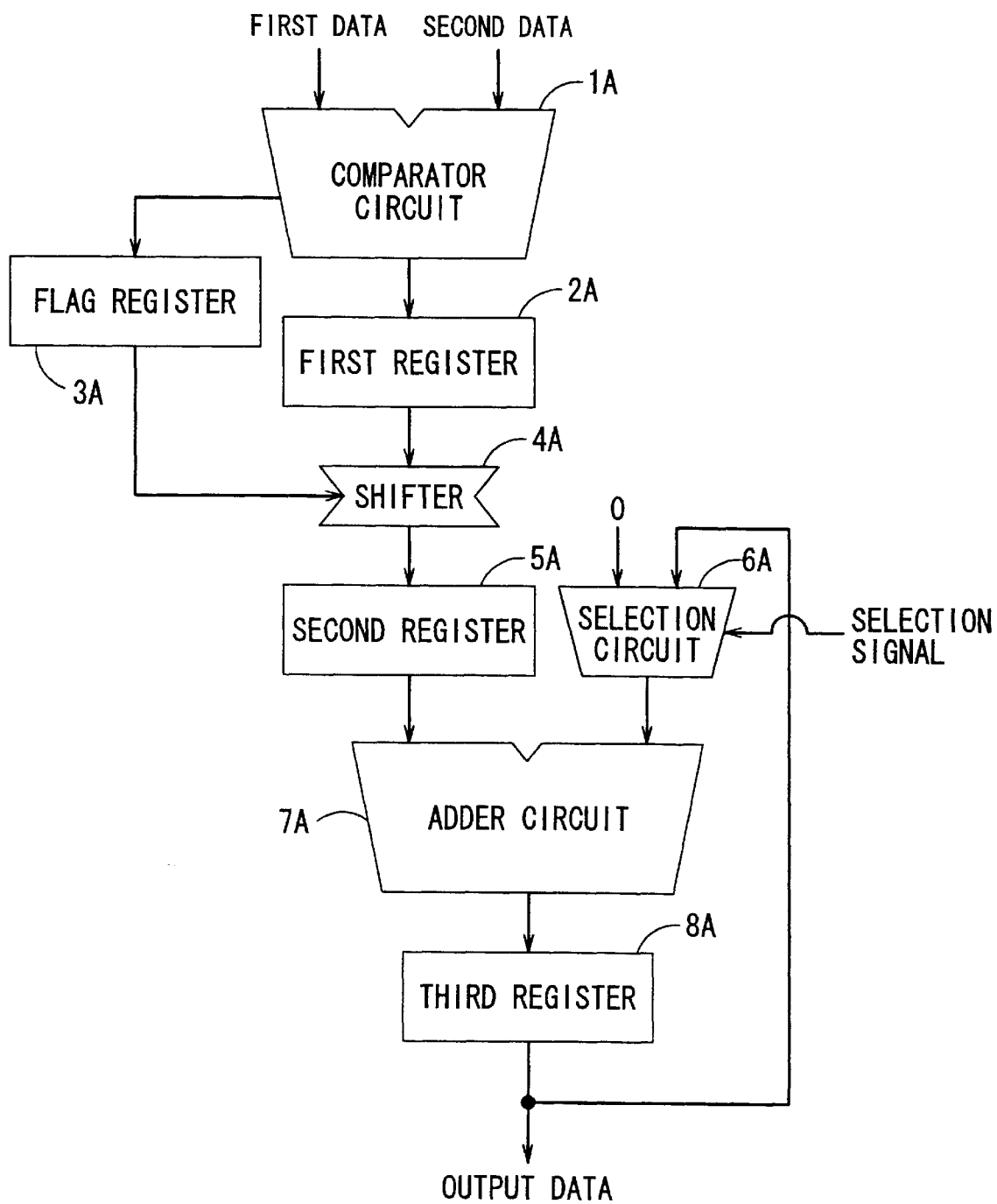

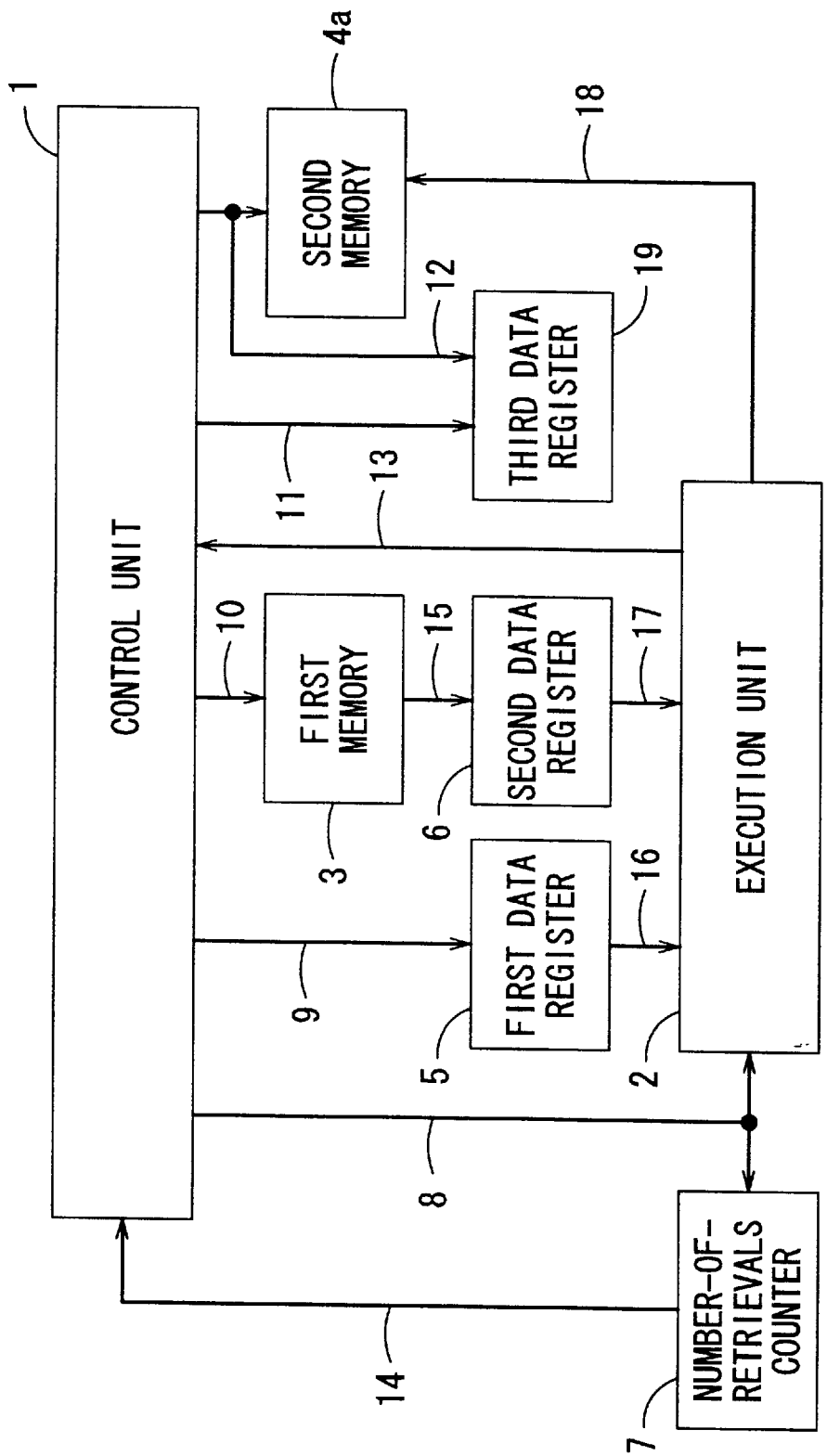
F I G. 7

ARITHMETIC UNIT AND DATA PROCESSING UNIT

BACKGROUND OF THE INVENTION

1. Field of the Invention

The present invention relates to an arithmetic unit and a data processing unit mounted in a digital signal processor and the like.

2. Description of the Prior Art

A prior art data processing unit for performing data comparison will be described below. The prior art data processing unit hereinafter described is primarily used as a special-purpose circuit when performing variable length encoding of image information, etc. after a discrete cosine transform. The prior art data processing unit has the circuitry shown, for example, in FIG. 16, in which reference character $1x$ is a memory (8-bit-data memory with addresses 0 to 63), $2x$ is a read control circuit, $3x$ is a zero run counter, $4x$ is a zero decoder, $5x$ is memory data, $6x$ is a memory read control signal, $7x$ is an enable signal, $8x$ is a zero decode signal, and $9x$ is a zero run count signal. Further, reference character $10x$ is a variable length encoder for performing variable length encoding.

Operation of the thus configured data processing unit will be described below with reference to the waveform diagram of FIG. 17 (reference characters shown correspond to those in FIG. 16). In FIG. 17, a typical memory readout address signal is depicted as the memory readout control signal $6x$.

Waveform $1w$ in FIG. 17 is used as the operating clock (CLK) of the data processing unit of FIG. 16. The read control circuit $2x$ in FIG. 16 reads out the memory data $5x$ at the address specified by the memory readout control signal $6x$ when the enable signal $7x$ is at a high level (hereinafter referred to as H level) (in the illustrated example, addresses are generated in the order of 0, 1, 2, . . . , 63).

The zero decoder $4x$ decodes the memory data $5x$ and, when the memory data shows a value 0, sets the zero decode signal $8x$ to the H level. At this time, the zero run counter $3x$ counts up, thus counting the number of 0s occurring consecutively. When the zero decode signal $8x$ is at a Low level (hereinafter referred to as the L level), the zero run counter $3x$ shows a value 0.

The thus generated zero run count signal $9x$ and the zero decode signal $8x$ are output together with the memory data $5x$; the variable length encoder circuit $10x$ at the following stage performs data processing using the zero run count signal $9x$ and memory data $5x$ at the time that the zero decode signal $8x$ is at the L level. Variable length encoding is a process in which data is compressed by treating the number of consecutive data zeros and the nonzero data following the data zeros as one set of data. Strictly speaking, quantization is performed before the variable length encoding. In the illustrated example, the zero run count signal $9x$ indicates the number of consecutive data zeros and the memory data $5x$ the nonzero data.

Since specialized circuitry, such as the zero run counter $3x$ and the zero decoder $4x$, is used to sequentially detect and output the number of consecutive zeros and the nonzero data following the data zeros, the prior art data processing unit lacks versatility and cannot, for example, detect the number of consecutive data values other than zeros; further, when, for example, it becomes necessary to perform an addition or comparison in addition to sequentially detecting and outputting the number of consecutive data zeros and the nonzero data following the data zeros, extra circuitry for performing the addition or comparison has to be added.

Furthermore, the prior art data processing unit, when mounted as a special-purpose circuit in a digital signal processor or the like, is not able to continuously perform the data processing using the zero run count signal $9x$ and memory data $5x$ if zeros continue to appear in the memory data. The reason is that, since data compression is performed using both the number of consecutive zeros and the nonzero data, it is not possible to produce the output of the zero run counter $3x$ and the output of the nonzero data in every cycle.

The prior art data processing unit has also had the problems that it lacks versatility because it is designed for performing data processing on fixed data (in the above example, data zeros), and that the processing time increases since data retrieval is performed through the entire memory even in the case of data that may be all zeros beyond a certain memory range.

SUMMARY OF THE INVENTION

It is an object of the present invention to provide an arithmetic unit with sufficient versatility to be able to not only perform the processing to sequentially detect and output the number of consecutive data zeros and the nonzero data following the data zeros but also perform other processing.

It is another object of the present invention to provide an arithmetic unit with sufficient versatility to be able to not only perform the processing to sequentially detect and output the number of consecutive data zeros and the nonzero data following the data zeros but also perform similar processing on data of values other than zero.

It is a further object of the present invention to provide a data processing unit that can continuously perform data processing.

It is still another object of the present invention to provide a data processing unit that can shorten the processing time required to process data.

It is yet another object of the present invention to provide a data processing unit that can increase the degree of freedom of data processing programs.

A first arithmetic unit of the present invention comprises a comparator circuit, a shifter, an adder circuit, a register, and a selection circuit. The comparator circuit takes as inputs first data as comparison reference data and second data as data to be compared with the first data, and performs a comparison between the first and the second data; when the first and the second data match as the result of the comparison, the comparator circuit outputs a value 1 and sets a match signal active, while, when the first and the second data do not match, the comparator circuit outputs the second data and sets the match signal inactive. The shifter accepts an output of the comparator circuit at its input, and shifts, or does not shift, the output of the comparator circuit, depending on the state of the match signal supplied from the comparator circuit. The adder circuit accepts an output of the shifter at one input thereof. The register accepts an output of the adder circuit at its input. The selection circuit accepts a value 0 at one input thereof and an output of the register at the other input, and couples one or the other of its inputs to the other input of the adder circuit in accordance with a selection signal.

With the selection circuit selecting either the value 0 or the output of the register in accordance with the selection signal, when the first and the second data do not match, the second data that does not match the first data is output by being paired with a count of the number of times that the second data matched the first data since the last occurrence of a mismatch between the first and the second data.

According to the above configuration, with the provision of the comparator circuit for performing a comparison between the first and second data, the shifter for accepting the output of the comparator circuit at its input, and for shifting or not shifting the output of the comparator circuit depending on the state of the match signal supplied from the comparator circuit, the adder circuit for cumulatively adding the output of the shifter, and the selection circuit, not only can the processing to sequentially detect and output the number of consecutive data zeros and the nonzero data following the data zeros be performed, but similar processing can also be performed on data of values other than zero. This provides great versatility.

It is also possible to use only the function of the comparator circuit by controlling the shifter, adder circuit, and selection circuit, only the function of the shifter by controlling the comparator circuit, adder circuit, and selection circuit, or only the function of the adder circuit by controlling the comparator circuit, shifter, and selection circuit. This adds great versatility to the arithmetic unit.

A second arithmetic unit of the present invention comprises a comparator circuit, a flag register, a first register, a shifter, a second register, a third register, and a selection circuit. The comparator circuit takes as inputs first data as comparison reference data and second data as data to be compared with the first data, and performs a comparison between the first and the second data; when the first and the second data match as the result of the comparison, the comparator circuit outputs a value 1 and sets a match signal active, while, when the first and the second data do not match, the comparator circuit outputs the second data and sets the match signal inactive. The flag register accepts the match signal at its input. The first register accepts an output of the comparator circuit at its input. The shifter accepts an output of the first register at its input, and shifts, or does not shift, the output of the first register, depending on the state of the match signal supplied from the flag register. The second register accepts an output of the shifter at its input. The adder circuit accepts an output of the second register at one input thereof. The third register accepts an output of the adder circuit at its input. The selection circuit accepts a value 0 at one input thereof and an output of the third register at the other input, and couples one or the other of its inputs to the other input of the adder circuit in accordance with a selection signal.

With the selection circuit selecting either the value 0 or the output of the third register in accordance with the selection signal, when the first and the second data do not match, the second data that does not match the first data is output by being paired with a count of the number of times that the second data matched the first data since the last occurrence of a mismatch between the first and the second data.

According to the above configuration, in addition to the same effects as achieved with the first arithmetic unit, the interposition of the first and second registers and the flag register between the comparator circuit, the shifter, and the adder circuit offers an additional effect; that is, with this arrangement, if the comparator circuit, the shifter, and the adder circuit are not fast in operation, not only can the processing to sequentially detect and output the number of consecutive data zeros and the nonzero data following the data zeros be performed, but similar processing can also be performed on data of values other than zero.

A first data processing unit according to the present invention comprises: a control unit which, when executing an instruction, outputs a memory read control signal, a memory write control signal, an instruction execution signal, a comparison reference data setting signal, and an end flag signal; a first memory to which the memory read control signal is input; a first data register to which the comparison reference data setting signal is input to set comparison reference data therein; a second data register which stores data from the first memory; a number-of-retrievals counter to which the instruction execution signal is input, and which outputs to the control unit a count of the number of data retrievals so far performed on the first memory; an execution unit to which the instruction execution signal and output data from the first data register and the second data register are input, and which outputs a comparison signal and an execution data signal; and a second memory to which the memory write control signal, the execution data signal from the execution unit, and the end flag signal are input.

In the above configuration, when executing a comparison instruction, the output data from the first data register and the second data register are loaded by the instruction execution signal into the execution unit for data comparison and, at the same time, the number-of-retrievals counter is made to count up, wherein the end flag signal is held inactive until the output of the number-of-retrievals counter reaches a predetermined value and, upon the output of the number-of-retrievals counter reaching the predetermined value, the control unit terminates the comparison instruction and sets the end flag signal active, while the comparison signal from the execution unit is output to the control unit to control writing to the second memory so that the end flag signal and the execution data signal, indicating the number of times that the output data matched and data from the first memory that did not match the comparison reference data, are written to the second memory when the end flag signal is held inactive and also when the end flag signal is set active.

According to the above configuration, the comparison instruction can be executed for any given value by setting desired comparison reference data in the first data register, and can be terminated by the action of the number-of-retrievals counter counting the number of retrievals performed within the comparison range, and the end flag signal can thus be written to the second memory, so that the last written data can be detected by just reading the data written in the second memory.

As described above, since the number of times the comparison data matched, the data that did not match, and the end flag signal are written to the second memory, and since the data in the second memory can be read out (in the order in which the data were written) in each cycle at any later time, subsequent data processing such as variable length encoding can be performed without interruption. Furthermore, any data can be handled by setting any given value in the first data register, and the versatility is thus increased.

Further, by writing the number of times the comparison data matched, the data that did not match, and the end flag signal to the second memory, a variable length encoding instruction can be executed any time without having to be limited to the time at which a count of the number of times the comparison data matched and the data that did not match, based on which variable length encoding is performed, are latched.

Furthermore, when the execution unit is configured to have other functions than the detection of the number of values 0, since it has a path via which to store data in the second memory, the execution unit of such a configuration can also be used without losing its versatility.

When generating data for variable length encoding using specialized circuitry, as in the prior art example, it is not possible to perform arithmetic operations other than those for the generation of data for variable length encoding; if other operations such as additions and comparisons in addition to the generation of data for variable length encoding are to be performed, it will become necessary to provide general-purpose circuitry such as an adder and comparator in addition to the specialized circuitry designed for the generation of data for variable length encoding, and the chip area of the integrated circuit will increase. On the other hand, in the present invention, since the circuitry provided for the generation of data for variable length encoding can be designed with versatility, other operations such as additions and comparisons can also be performed using the same circuitry. Accordingly, not only the processing for the generation of data for variable length encoding but also other processing can be performed without requiring increasing the chip area of the integrated circuit compared with the configuration designed exclusively for the generation of data for variable length encoding.

Furthermore, since the data before variable length encoding is held in the second memory, it is possible to verify whether or not the variable length encoded data has been correctly converted by comparing the variable length encoded data with the data held in the second memory, and the variable length encoded data can thus be debugged.

The last written data earlier mentioned refers to the data that was written at the last address when comparing data in the first memory, for example, from a certain address to a certain address. Upon detecting the last written data, the execution of the comparison instruction is terminated, and the end flag signal is written to the second memory.

When performing processing for variable length encoding or the like, data written by the comparison instruction is read out, and by reading the last written data containing the end flag signal, the end of the data can be detected, thus making it possible to perform variable length encoding without any problem.

A second data processing unit of the present invention comprises: a control unit which, when executing an instruction, outputs a memory read control signal, a memory write control signal, an instruction execution signal, a comparison reference data setting signal, and an end flag signal; a first memory to which the memory read control signal is input; a first data register to which the comparison reference data setting signal is input to set comparison reference data therein; a second data register which stores data from the first memory; a number-of-retrievals counter to which the instruction execution signal is input, and which outputs to the control unit a count of the number of data retrievals so far performed on the first memory; an execution unit to which the instruction execution signal and output data from the first data register and the second data register are input, and which outputs a comparison signal and an execution data signal; a second memory to which the memory write control signal and the execution data signal from the execution unit are input; and a third data register to which the end flag signal is input, and which stores the address of data stored in the second memory.

In the above configuration, when executing a comparison instruction, the output data from the first data register and the second data register are loaded by the instruction execution signal into the execution unit for data comparison and, at the same time, the number-of-retrievals counter is made to count up, wherein the end flag signal is held inactive until the output of the number-of-retrievals counter reaches a predetermined value and, upon the output of the number-of-retrievals counter reaching the predetermined value, the control unit terminates the comparison instruction and sets the end flag signal active, while the comparison signal from the execution unit is output to the control unit to control writing to the second memory so that the end flag signal and the execution data signal, indicating the number of times that the output data matched and data from the first memory that did not match the comparison reference data, are written to the second memory when the end flag signal is held inactive and also when the end flag signal is set active, and so that the address last written to the second memory is stored in the third data register when the end flag signal is set active.

According to the above configuration, the comparison instruction can be executed for any given value by setting desired comparison reference data in the first data register, and can be terminated by the action of the number-of-retrievals counter counting the number of retrievals performed within the comparison range, and the end flag signal can thus be generated and the memory address be stored in the third data register functioning as a memory address setting register; accordingly, the memory address where the last written data is stored can be detected by just reading the data from the third data register.

As described above, since the number of times the comparison data matched and the data that did not match are written to the second memory, and since the data in the. second memory can be read out in each cycle at any later time, data processing such as variable length encoding can be performed without interruption. Further, since the memory address where the last written data is stored is held in the third register instead of writing the end flag signal to the second memory, the bit count of the second memory can be reduced. In the case of the first data processing unit, an extra bit is required for the end flag. In the second data processing unit, on the other hand, the address where the last written data is stored can be found by reading the third register.

Furthermore, any data can be handled by setting any given value in the first data register, and the versatility is thus increased.

The other effects are the same as those obtained with the first data processing unit.

A third data processing unit of the present invention comprises: a control unit which, when executing an instruction, outputs a memory read control signal, a memory write control signal, an instruction execution signal, a comparison reference data setting signal, an end flag signal, and a number-of-retrievals setting signal; a first memory to which the memory read control signal is input; a first data register to which the comparison reference data setting signal is input to set comparison reference data therein; a second data register which stores data from the first memory; a number-of-retrievals counter to which the instruction execution signal is input, and which outputs a count of the number of data retrievals so far performed on the first memory; a third data register to which the number-of-retrievals setting signal is input to set therein an end value for the number of retrievals; an execution unit to which the instruction execution signal and output data from the first data register and the second data register are input, and which outputs a comparison signal and an execution data signal; a second memory to which the memory write control signal, the execution data signal from the execution unit, and the end flag signal are input; and a match detection circuit to which the output of the number-of-retrievals counter and the value set in the third register are input, and which outputs a match signal to the control unit.

In the above configuration, when executing a comparison instruction, the output data from the first data register and the second data register are loaded by the instruction execution signal into the execution unit for data comparison and, at the same time, the number-of-retrievals counter is made to count up, wherein the end flag signal is held inactive until the match signal is output from the match detection circuit and, in response to the match signal output from the match detection circuit, the control unit terminates the comparison instruction and sets the end flag signal active, while the comparison signal from the execution unit is output to the control unit to control writing to the second memory so that the end flag signal and the execution data signal, indicating the number of times that the output data matched and data from the first memory that did not match the comparison reference data, are written to the second memory when the end flag signal is held inactive and also when the end flag signal is set active.

According to the above configuration, the third data processing unit is capable of executing the comparison instruction for any given value by setting desired comparison reference data in the first data register, and can arbitrarily set the number of retrievals, to be performed within the comparison range, in the third data register, so that the comparison instruction can be terminated after performing an arbitrary number of retrievals. Since the end flag signal can thus be written to the second memory, the last written data can be detected by just reading out the data written to the second memory.

As described above, since the number of times the comparison data matched, the data that did not match, and the end flag signal are written to the second memory, and since the data in the second memory can be read out (in the order in which the data were written) in each cycle at any later time, data processing such as variable length encoding can be performed without interruption. Furthermore, any data can be handled by setting desired values in the third data register and the first data register, and the versatility is thus increased.

The other effects are the same as those obtained with the first data processing unit.

A fourth data processing unit of the present invention comprises: a control unit which, when executing an instruction, outputs a memory read control signal, a memory write control signal, an instruction execution signal, a comparison reference data setting signal, an end flag signal, a number-of-retrievals setting signal, and a selection signal; a first memory to which the memory read control signal is input; a first data register to which the comparison reference data setting signal is input to set comparison reference data therein; a second data register which stores data from the first memory; a third data register to which the number-of-retrievals setting signal is input to set therein an initial value for the number of retrievals; a number-of-retrievals counter to which the instruction execution signal and output data from the third data register are input, and which outputs a count of the remaining number of retrievals to be performed on the first memory; an execution unit to which the instruction execution signal and output data from the first data register and the second data register are input, and which outputs a comparison signal and an execution data signal; an adder to which the output of the number-of-retrievals counter and a number-of-matches data signal carried in the execution data signal are input; a selector which selects either an output of the adder or the number-of-matches data signal by the selection signal generated by the control unit in accordance with the number-of-matches data signal carried in the execution data signal; and a second memory to which the memory write control signal, data from the first memory that did not match the comparison reference data and that is carried in the execution data signal, an output of the selector, and the end flag signal are input.

In the above configuration, when executing a comparison instruction, the output data from the first data register and the second data register are loaded by the instruction execution signal into the execution unit for data comparison and, at the same time, the number-of-retrievals counter is made to count down, wherein the end flag signal is held inactive until the output of the number-of-retrievals counter reaches a first predetermined value or until the number-of-matches data signal carried in the execution data signal reaches a second predetermined value and, upon the output of the number-of-retrievals counter reaching the first predetermined value or upon the number-of-matches data signal carried in the execution data signal reaching the second predetermined value, the control unit terminates the comparison instruction and sets the end flag signal active, while the comparison signal from the execution unit is output to the control unit to control writing to the second memory so that the end flag signal and the execution data signal, indicating the number of times that the output data matched and data from the first memory that did not match the comparison reference data, are written to the second memory when the end flag signal is held inactive and also when the end flag signal is set active, and so that, when the number-of-matches data signal carried in the execution data signal reaches the predetermined value, all data remaining to be compared are assumed to match the comparison reference data, and the output of the adder, the data from the first memory that matched, and the end flag signal are written to the second memory.

According to the above configuration, the fourth data processing unit is capable of executing the comparison instruction for any given value by setting desired comparison reference data in the first data register, and can arbitrarily set the number of retrievals, to be performed within the comparison range, in the third data register, so that the comparison instruction can be terminated after performing an arbitrary number of retrievals. Furthermore, when data matches occur consecutively, the comparison instruction can be terminated by assuming that the remaining data also match the comparison reference data, thus shortening the entire retrieval time. Since the end flag signal is thus written to the second memory, the last written data can be detected by just reading out the data written to the second memory.

As described above, since the number of times the comparison data matched, the data that did not match, and the end flag signal are written to the second memory, and since the data in the second memory can be read out (in the order in which the data were written) in each cycle at any later time, data processing such as variable length encoding can be performed without interruption. Furthermore, when data matches occur consecutively, the comparison instruction can be terminated by assuming that the remaining data also match the comparison reference data; this serves to shorten the entire retrieval time, hence shortening the processing time. Moreover, any data can be handled by setting desired values in the number-of-retrievals counter and the first data register, and the versatility is thus increased.

The other effects are the same as those obtained with the first data processing unit.

A fifth data processing unit of the present invention comprises: a control unit which, when executing an instruction, outputs a memory read control signal, a memory write control signal, an instruction execution signal, a comparison reference data setting signal, an end flag signal, a number-of-retrievals setting signal, a number-of-consecutive-matches setting signal, and a selection signal; a first memory to which the memory read control signal is input; a first data register to which the comparison reference data setting signal is input to set comparison reference data therein; a second data register which stores data from the first memory; a third data register to which the number-of-retrievals setting signal is input to set therein an initial value for the number of retrievals; a fourth data register to which the number-of-consecutive-matches setting signal is input to set the number of times that data matches may occur consecutively; a number-of-retrievals counter to which the instruction execution signal and output data from the third data register are input, and which outputs a count of the remaining number of retrievals to be performed on the first memory; an execution unit to which the instruction execution signal and output data from the first data register and the second data register are input, and which outputs a comparison signal and an execution data signal; an adder to which the output of the number-of-retrievals counter and a number-of-matches data signal carried in the execution data signal are input; a match detection circuit to which the number-of-matches data signal and an output of the fourth data register are input for detection of a data match therebetween; a selector which selects either an output of the adder or the number-of-matches data signal by the selection signal generated by the control unit in accordance with an output from the match detection circuit; and a second memory to which the memory write control signal, data from the first memory that did not match the comparison reference data and that is carried in the execution data signal, an output of the selector, and the end flag signal are input.

In the above configuration, when executing a comparison instruction, the output data from the first data register and the second data register are loaded by the instruction execution signal into the execution unit for data comparison and, at the same time, the number-of-retrievals counter is made to count down, wherein the end flag signal is held inactive until the output of the number-of-retrievals counter reaches a predetermined value or until the output of the match detection circuit indicates a match and, upon the output of the number-of-retrievals counter reaching the predetermined value or in response to the output of the match detection circuit indicating a match, the control unit terminates the comparison instruction and sets the end flag signal active, while the comparison signal from the execution unit is output to the control unit to control writing to the second memory so that the end flag signal and the execution data signal, indicating the number of times that the output data matched and data from the first memory that did not match the comparison reference data, are written to the second memory when the end flag signal is held inactive and also when the end flag signal is set active, and so that, when the output of the match detection circuit indicates a match, all data remaining to be compared are assumed to match the comparison reference data, and the output of the adder, the data from the first memory that matched, and the end flag signal are written to the second memory.

According to the above configuration, the fifth data processing unit is capable of executing the comparison instruction for any given value by setting desired comparison reference data in the first data register, and can arbitrarily set the number of retrievals, to be performed within the comparison range, in the third data register, so that the comparison instruction can be terminated after performing an arbitrary number of retrievals. Furthermore, by presetting the desired number of matches in the fourth data register, when data matches occur consecutively the preset number of times, the comparison instruction can be terminated by assuming that the remaining data also match the comparison reference data, thus shortening the entire retrieval time. Since the end flag signal is thus written to the second memory, the last written data can be detected by just reading out the data written to the second memory.

As described above, since the number of times the comparison data matched, the data that did not match, and the end flag signal are written to the second memory, and since the data in the second memory can be read out (in the order in which the data were written) in each cycle at any later time, data processing such as variable length encoding can be performed without interruption. Furthermore, by presetting the desired number of matches in the fourth data register, when data matches occur consecutively the preset number of times, the comparison instruction can be terminated by assuming that the remaining data also match the comparison reference data, thus making it possible to shorten the entire retrieval time and hence the processing time. Moreover, any data can be handled by setting desired values in the search count counter and the first data register, and the versatility is thus increased.

The other effects are the same as those obtained with the first data processing unit.

A sixth data processing unit of the present invention is the same as the first, second, third, fourth, of fifth data processing unit of the present invention, wherein the execution unit comprises: a comparator circuit which takes as inputs the output of the first data register as first data to serve as comparison reference data and the output of the second data register as second data to be compared with the first data, and performs a comparison between the first and the second data, and which, when the first and the second data match as the result of the comparison, outputs a value 1 and sets a match signal active, and when the first and the second data do not match, outputs the second data and sets the match signal inactive; a shifter to which an output of the comparator circuit is input, and which shifts, or does not shift, the output of the comparator circuit, depending on the state of the match signal supplied from the comparator circuit; an adder circuit which accepts an output of the shifter at one input thereof; a register to which an output of the adder circuit is input; and a selection circuit which accepts a value 0 at one input thereof and an output of the register at the other input, and which couples one or the other of its inputs to the other input of the adder circuit in accordance with a selection signal.

With the selection circuit selecting either the value 0 or the output of the register in accordance with the selection signal, when the first and the second data do not match, the second data that does not match the first data is output as the execution data signal by being paired with a count of the number of times that the second data matched the first data since the last occurrence of a mismatch between the first and the second data.

According to the above configuration, the same effects as obtained with the first arithmetic unit of the present invention can be achieved in addition to the effects obtained with the first, second, third, fourth, or fifth data processing unit of the present invention.

A seventh data processing unit of the present invention is the same as the first, second, third, fourth, or fifth data processing unit of the present invention, wherein the execution unit comprises: a comparator circuit which takes as inputs the output of the first data register as first data to serve as comparison reference data and the output of the second data register as second data to be compared with the first data, and performs a comparison between the first and the second data, and which, when the first and the second data match as the result of the comparison, outputs a value 1 and sets a match signal active, and when the first and the second data do not match, outputs the second data and sets the match signal inactive; a flag register to which the match signal is input; a first register to which an output of the comparator circuit is input; a shifter to which an output of the first register is input, and which shifts, or does not shift, the output of the first register, depending on the state of the match signal supplied from the flag register; a second register to which an output of the shifter is input; an adder circuit which accepts an output of the second register at one input thereof; a third register to which an output of the adder circuit is input; and a selection circuit which accepts a value 0 at one input thereof and an output of the third register at the other input, and which couples one or the other of its inputs to the other input of the adder circuit in accordance with a selection signal.

With the selection circuit selecting either the value 0 or the output of the third register in accordance with the selection signal, when the first and the second data do not match, the second data that does not match the first data is output as the execution data signal by being paired with a count of the number of times that the second data matched the first data since the last occurrence of a mismatch between the first and the second data.

According to the above configuration, the same effects as obtained with the second arithmetic unit of the present invention can be achieved in addition to the effects obtained with the first, second, third, fourth, or fifth data processing unit of the present invention.

BRIEF DESCRIPTION OF THE DRAWINGS

FIG. 1 is a block diagram showing the configuration of an arithmetic unit according to first and second embodiments of the present invention;

FIG. 7 is a block diagram showing the configuration of a data processing unit according to a fourth embodiment of the present invention;

DESCRIPTION OF THE PREFERRED EMBODIMENTS

Embodiment 1

Figure 2:
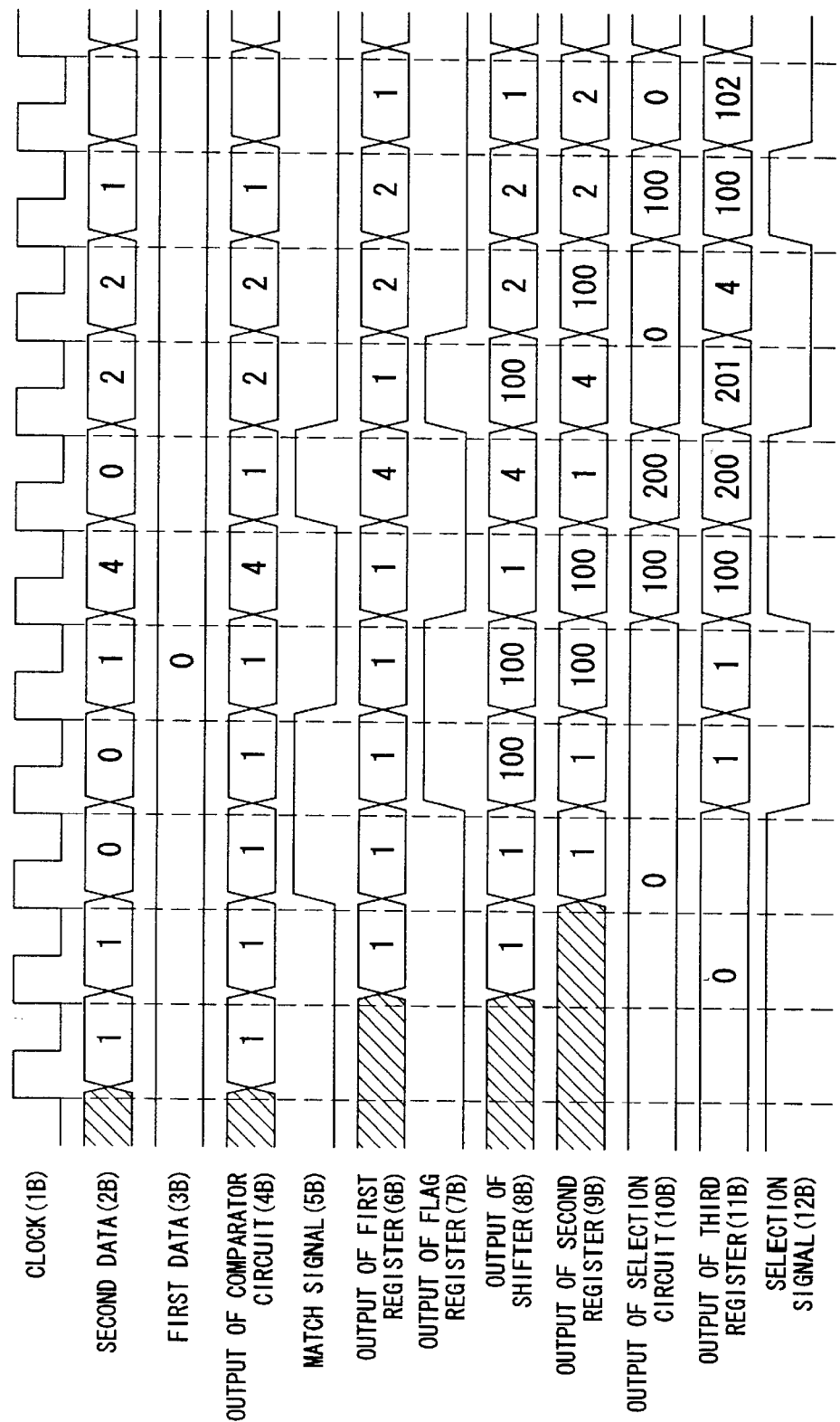
FIG. 2 is a diagram showing operating waveforms of the arithmetic unit according to the first embodiment of the present invention.

An arithmetic unit according to a first embodiment of the present invention will be described with reference to FIGS. 1 and 2. (Numeric values are given in hexadecimal notation)

FIG. 1 is a block diagram showing the configuration of the arithmetic unit according to the first embodiment of the present invention. In FIG. 1, reference character 1A is a comparator circuit, 2A is an 8-bit first register, 3A is a flag register, 4A is a shifter, 5A is a 9-bit second register, 6A is a selection circuit, 7A is an adder circuit for performing cumulative additions, and 8A is a 14-bit third register.

The operation of the arithmetic circuit will be described below. The comparator circuit 1A performs a comparison between the first data (waveform 3B in FIG. 2, value 0 in HEX) and second data (waveform 2B in FIG. 2) output in synchronism with the rising of an operating clock (waveform 1B in FIG. 2) and, when the value of the second data is 0, sets a match signal to a high level and outputs it to the flag register 3A which latches it (waveform 7B in FIG. 2) in synchronism with the rising of the operating clock. At the same time, the comparator circuit 1A outputs a value 1 (waveform 4B in FIG. 2) to the first register 2A which latches it (waveform 6B in FIG. 2) in synchronism with the rising of the operating clock.

On the other hand, when the first and second data do not match, the comparator circuit 1A sets the match signal (waveform 5B in FIG. 2) to a low level and outputs it to the flag register 3A which latches it (waveform 7B in FIG. 2) in synchronism with the rising of the operating clock. At the same time, the comparator circuit 1A outputs the second data (waveform 4B in FIG. 2) to the first register 2A which latches it (waveform 6B in FIG. 2) in synchronism with the rising of the operating clock.

When the match signal (waveform 7B in FIG. 2) is at the high level, the shifter 4A shifts the value of the first register 2A (waveform 6B in FIG. 2) by 8 bits to the left, and outputs the resulting value 100 (in HEX, waveform 8B in FIG. 2) to the second shift register 5A (waveform 8B in FIG. 2) which latches it (waveform 9B in FIG. 2) in synchronism with the rising of the operating clock. On the other hand, when the match signal is at the low level, the shifter 2A does not shift the value of the first register 2A (waveform 6B in FIG. 2), but outputs the value of the first register 2A unchanged (waveform 8B in FIG. 2) to the second register 5A which latches it (waveform 9B in FIG. 2) in synchronism with the rising of the operating clock.

The selection circuit 6A outputs a value 0 (waveform 10B in FIG. 2) when a selection signal (waveform 12B in FIG. 2) is at the low level and, when it is at the high level, selects the output of the third register 8A (waveform 11B in FIG. 2) which latches the output of the adder circuit 7A in synchronism with the rising of the clock.

The adder circuit 7A takes as inputs the output of the second register 5A (waveform 9B in FIG. 2) and the output of the selection circuit 6A (waveform 10B in FIG. 2), adds them together, and outputs the result of the addition to the third register 8A for accumulation. Here, the third register 8A must be initialized before performing a series of arithmetic operations, and the value when the selection signal is low is output as the result of the calculation from the arithmetic unit. Of the 14 bits in the result of the calculation from the arithmetic unit, the low order 8 bits indicate nonzero data and the high order 6 bits represents a count of the number of consecutive zeros.

This arithmetic unit is capable of performing the above-described operations not only on data of value zero but also on every other data by changing the value of the first data, and is also capable of using only the function of the comparator circuit 1A by controlling the shifter 4A, adder circuit 7A, and selection circuit 6A, only the function of the shifter 4A by controlling the comparator circuit 1A, adder circuit 7A, and selection circuit 6A, or only the function of the adder circuit 7A by controlling the comparator circuit 1A, shifter 4A, and selection circuit 6A. This adds great versatility to the arithmetic unit.

Furthermore, with the provision of the first and second shift registers 2A and 5A and the flag register 3A, if the comparator circuit 1A, the shifter 4A, and the adder circuit 7A are not fast in operation, not only can the processing to sequentially detect and output the number of consecutive data zeros and the nonzero data following the data zeros be performed, but similar processing can also be performed on data of values other than zero.

In the above embodiment, the first register 2A and flag register 3A are arranged between the comparator circuit 1A and the shifter 4A, and the second register 5A between the shifter 4A and the adder circuit 7A, but if further advances are made in miniaturization in the design of the arithmetic unit, achieving faster operations of the comparator circuit 1A, shifter 4A, and adder circuit 7A, it will become possible to omit the first register 2A, flag register 3A, and second register 5A. In that case, one-cycle delay through the first register 2A and flag register 3A would be eliminated from the signal applied from the comparator circuit 1A to the shifter 4A, and one-cycle delay through the second shift register 5A would also be eliminated from the signal applied from the shifter 4A to the adder circuit 7A Embodiment 2

Figure 3:
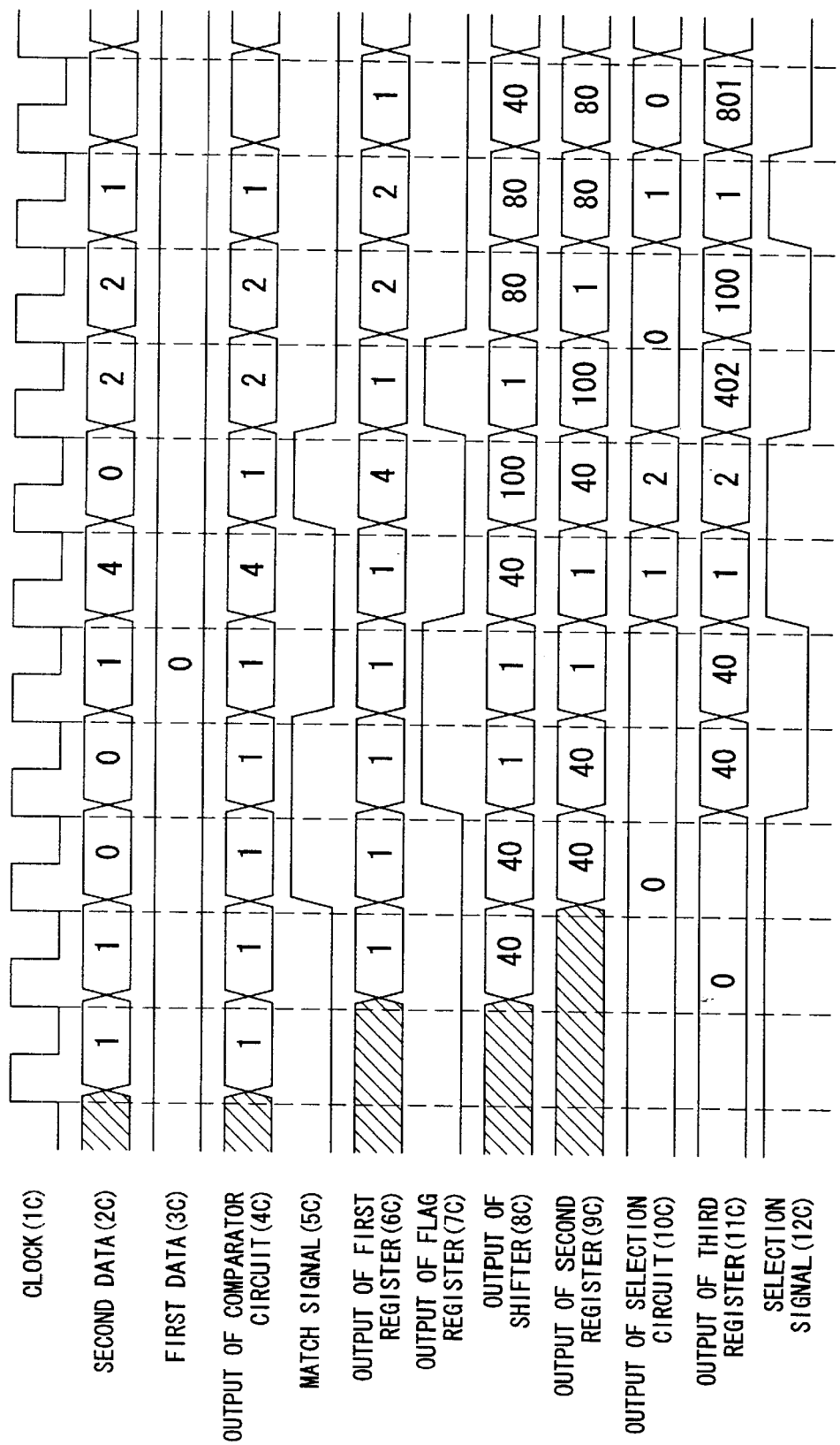
FIG. 3 is a diagram showing operating waveforms of the arithmetic unit according to the second embodiment of the present invention.

An arithmetic unit according to a second embodiment of the present invention will be described with reference to FIGS. 1 and 3. (Numeric values are given in hexadecimal notation)

FIG. 1 is a block diagram showing the configuration of the arithmetic unit according to the second embodiment of the present invention. The configuration is the same as that described in the first embodiment, the only difference from the first embodiment being that the 9-bit second register 5A is replaced with a 14-bit register.

The operation of the arithmetic circuit will be described below. The comparator circuit 1A performs a comparison between the first data (waveform 3C in FIG. 3, value 0 in HEX) and second data (waveform 2C in FIG. 3) output in synchronism with the rising of the operating clock (waveform 1C in FIG. 3) and, when the value of the second data is 0, sets the match signal to a high level and outputs it to the flag register 3A which latches it (waveform 7C in FIG. 3) in synchronism with the rising of the operating clock. At the same time, the comparator circuit 1A outputs a value 1 (waveform 4C in FIG. 3) to the first register 2A which latches it in synchronism with the rising of the operating clock.

On the other hand, when the first and second data do not match, the comparator circuit 1A sets the match signal (waveform 5C in FIG. 3) to a low level and outputs it to the flag register 3A which latches it (waveform 7C in FIG. 3) in synchronism with the rising of the operating clock. At the same time, the comparator circuit 1A outputs the second data (waveform 4C in FIG. 3) to the first register 2A which latches it in synchronism with the rising of the operating clock.

When the match signal (waveform 7C in FIG. 3) is at the low level, the shifter 4A shifts the value of the first register 2A (waveform 6C in FIG. 3) by 6 bits to the left, and outputs the resulting value (in HEX, waveform 8C in FIG. 3) to the second shift register 5A (waveform 8C in FIG. 3) which latches it (waveform 9C in FIG. 3) in synchronism with the rising of the operating clock. On the other hand, when the match signal is at the high level, the shifter 2A does not shift the value of the first register 2A (waveform 6C in FIG. 3), but outputs the value of the first register 2A unchanged, that is, the value 1 (waveform 8C in FIG. 3), to the second register 5A which latches it (waveform 9C in FIG. 3) in synchronism with the rising of the operating clock The selection circuit 6A outputs a value 0 (waveform 10C in FIG. 3) when the selection signal (waveform 12C in FIG. 3) is at the low level and, when it is at the high level, selects the output of the third register 8A (waveform 11C in FIG. 3) which latches the output of the adder circuit 7A in synchronism with the rising of the clock.

The adder circuit 7A takes as inputs the output of the second register 5A (waveform 9C in FIG. 3) and the output of the selection circuit 6A (waveform 10C in FIG. 3), adds them together, and outputs the result of the addition to the third register 8A for accumulation. Here, the third register 8A must be initialized before performing a series of arithmetic operations, and the value when the selection signal is low is output as the result of the calculation from the arithmetic unit. Of the 14 bits in the result of the calculation from the arithmetic unit, the high order 8 bits indicate nonzero data and the low order 6 bits represents a count of the number of consecutive zeros.

The arithmetic unit, like the one in the foregoing first embodiment, has greatly increased versatility.

The effect obtained by the provision of the first and second registers 2A and 5A and flag register 3A is the same as that obtained in the first embodiment.

Furthermore, in common with the first embodiment, the second embodiment has the potential of being able to omit the first and second registers 2A and 5A and flag register 3A; in that case, the one-cycle delay through the first and second registers 2A and 5A and flag register 3A would be eliminated, as in the case of the first embodiment.

Embodiments of a data processing unit incorporating the arithmetic unit described in the first and second embodiments as a major constituent element of an execution unit will be described below.

Embodiment 3

A data processing unit according to a third embodiment of the present invention will be described with reference to FIGS. 4 to 6.

Figure 4:
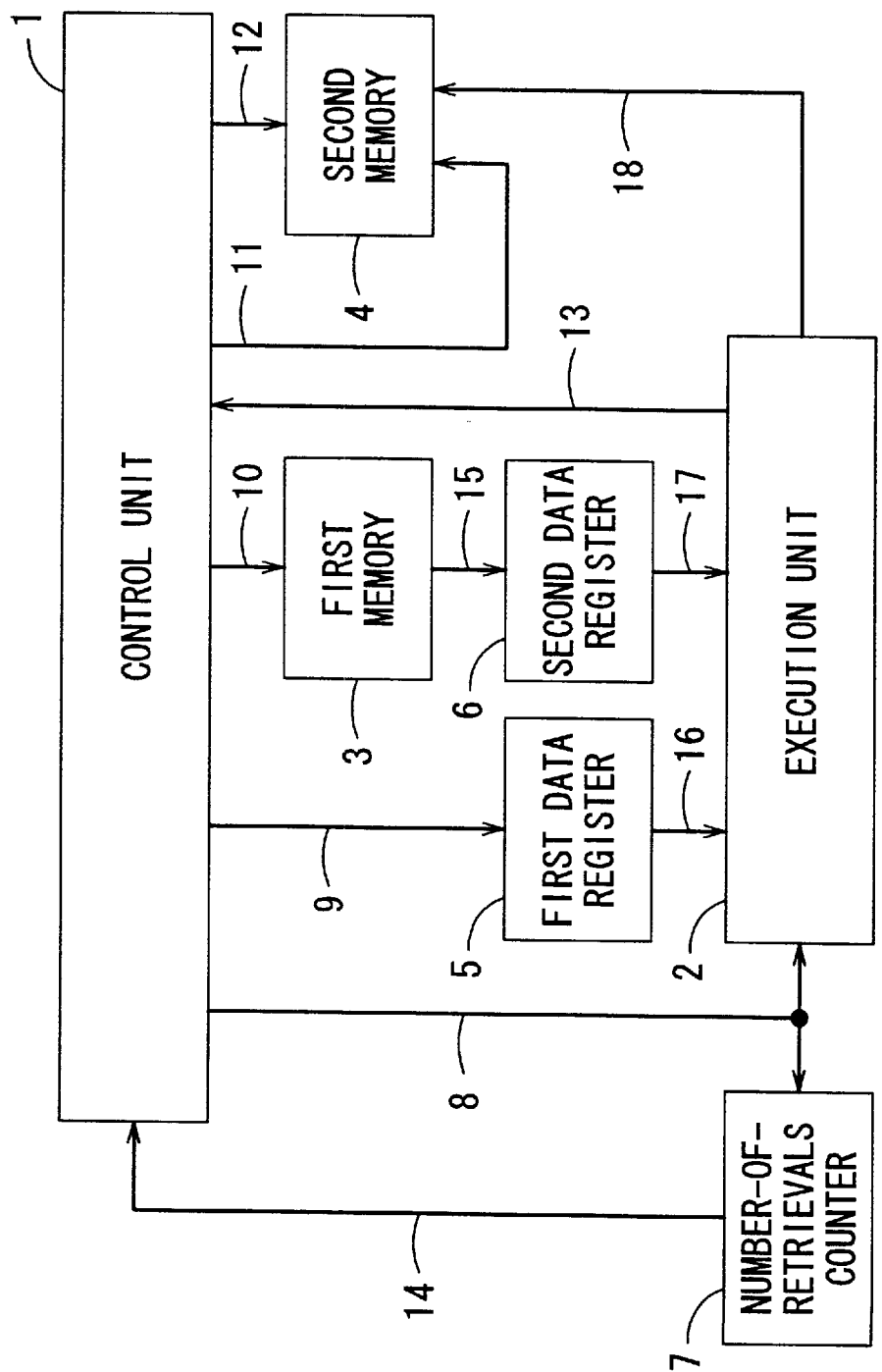
FIG. 4 is a block diagram showing the configuration of a data processing unit according to a third embodiment of the present invention.

FIG. 4 is a block diagram showing the configuration of the data processing unit according to the third embodiment of the present invention. In FIG. 4, reference character 1 is a control unit, 2 is an execution unit, 3 is a first memory, 4 is a second memory, 5 is a first data register as an 8-bit comparison reference data setting register, 6 is a second data register as an 8-bit memory data register, and 7 is a number-of-retrievals counter. The first data in the arithmetic unit of FIG. 1 is temporarily stored in the first data register 5, and likewise, the second data is temporarily stored in the second data register 6.

Further, reference character 8 is an instruction execution signal, 9 is a comparison reference data setting signal, 10 is a memory read control signal, 11 is an end flag signal, 12 is a memory write control signal, 13 is a comparison signal, 14 is an output signal of the number-of-retrievals counter 7, 15 is a memory data signal, 16 is an output signal of the first data register 5, 17 is an output signal of the second data register 6, and 18 is an execution data signal. The comparison signal 13 corresponds to the match signal output from the comparator circuit 1A or the output of the flag register 3A in the arithmetic unit of FIG. 1.

In the data processing unit of the third embodiment, the first memory 3 is organized as an 8-bit-data memory with addresses 0 to 63, and the second memory 4 as a 15-bit-data memory with addresses 0 to 63, while the number-of-retrievals counter 7 counts from 0 to 64. FIG. 5 is a diagram showing operating waveforms of the data processing unit according to the third embodiment of the present invention, and FIG. 6 is a diagram showing the contents of the s econd memory 4 at the completion of writing, wherein reference character 1z indicates the memory address (in decimal) 2z the memory data, 3z the number of matches, and 4z the end flag. The memory data 2z is the data written without being shifted in the arithmetic unit of FIG. 1, and the number of matches, 3z, is the data written after being shifted in the arithmetic unit of FIG. 1. Here, the position of the memory data 2z may be interchanged with the position of the number of matches, 3z, depending on how the shifter in the arithmetic unit is set up.

The operation of the thus configured data processing unit will be described below with reference to FIGS. 4 to 6.

Waveform 1w in FIG. 5 will be used as the operating clock (CLK) of the data processing unit of FIG. 4, and the data processing unit of FIG. 4 will be described as operating in synchronism with the rising edge of the operating clock 1w. The control unit 1 sets the instruction execution signal 8 (waveform 2w in FIG. 5) to the H level to execute a comparison instruction.

Figure 5:
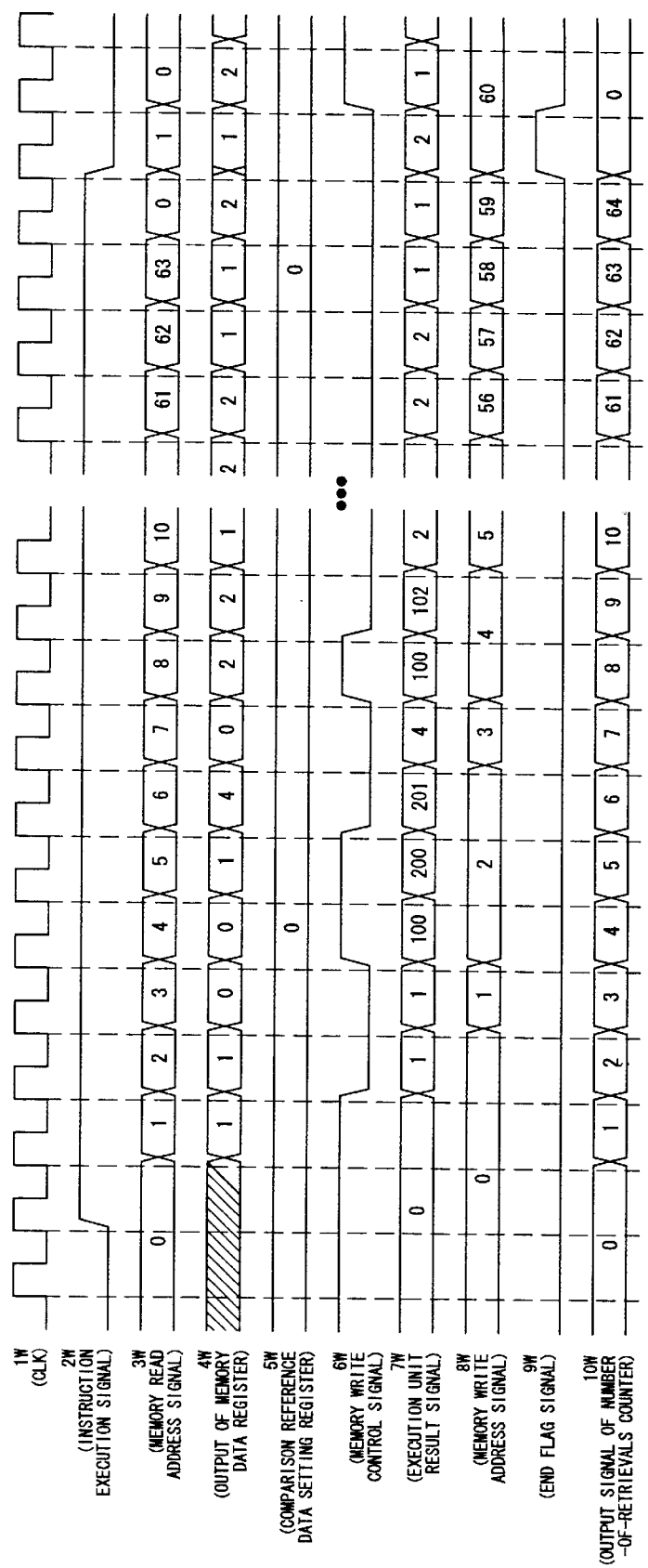
FIG. 5 is a diagram showing operating waveforms of the data processing unit according to the third embodiment of the present invention.

The control unit 1 outputs the memory read control signal 10, in response to which the memory data signal 15 at the address specified by the memory read address signal (waveform 3w in FIG. 5) carried in the control signal 10 is read out of the first memory 3 and stored in the second data register 6 (waveform 4w in FIG. 5). Prior to the execution of the comparison instruction, comparison reference data is set in the first data register 5 by using the comparison reference data setting signal 9 (waveform 5w in FIG. 5; comparison reference data value is 0).

In response to the instruction execution signal 8 carrying the comparison instruction, the execution unit 2 compares the output signal 17 (waveform 4w in FIG. 5) of the second data register 6 with the output signal 16 (waveform 5w in FIG. 5) of the first data register 5 and, when they match, outputs the comparison signal 13 to the control unit 1, thereby setting the memory write control signal 12 (waveform 6w in FIG. 5), to be output from the control unit 1, to the H level to inhibit writing to the second memory 4 and count the number of consecutive matches. When they do not match, on the other hand, the execution unit 2 writes its result signal (waveform 7w in FIG. 5) as the execution data signal 18, together with the end flag signal 11 (waveform 9w in FIG. 5), to the second memory 4 at the address (single address) specified by the memory write address signal (waveform 8w in FIG. 5) carried in the memory write control signal 12.

When the output signal 14 (waveform 10w in FIG. 5) of the number-of-retrievals counter 7 indicates 64, the control unit 1 sets the instruction execution signal 8 to the L level to terminate the comparison instruction and, at the same time, sets the end flag signal 11 to the H level.

Figure 6:
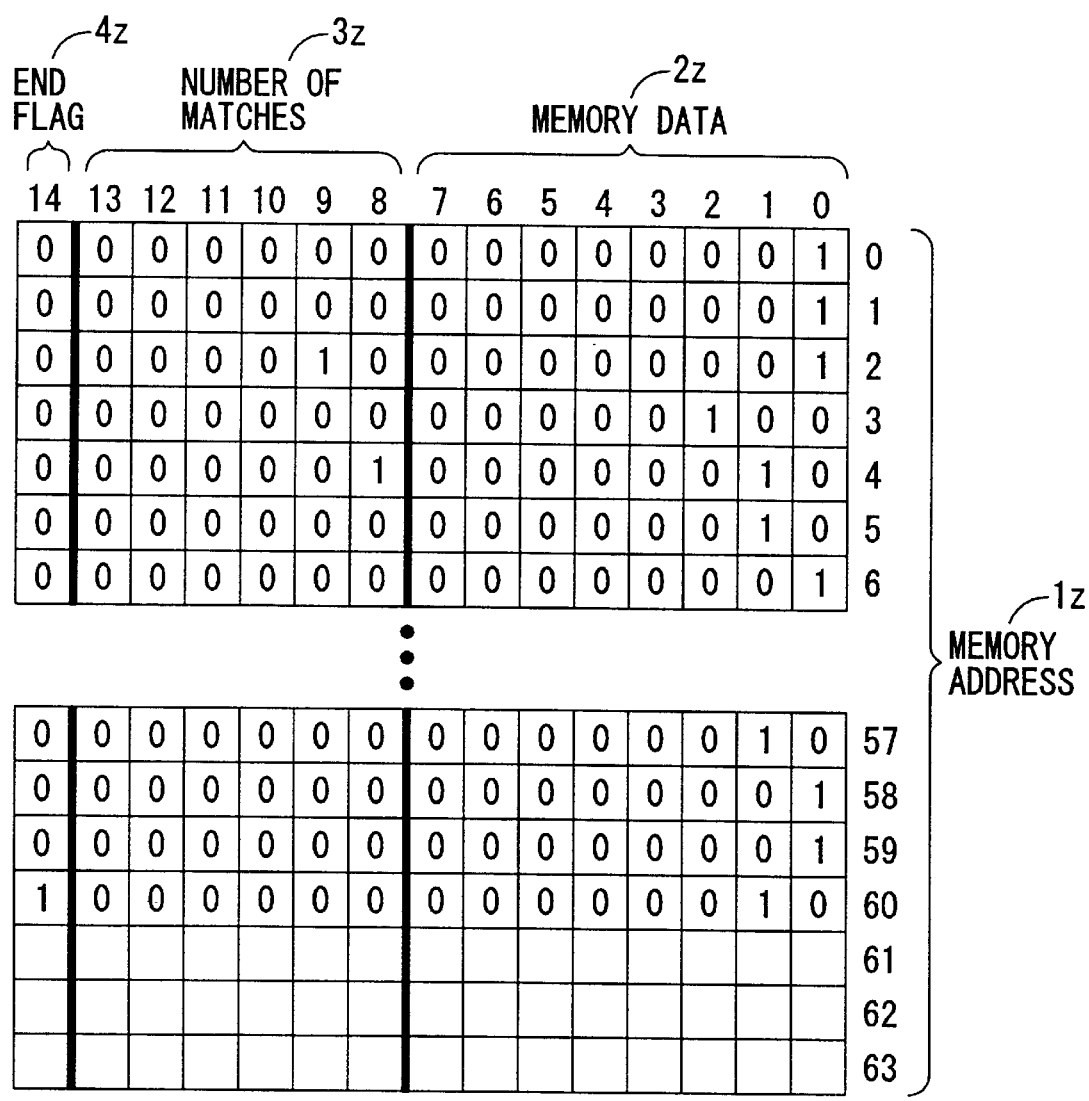
FIG. 6 is a diagram showing in simplified form the memory configuration at the completion of writing in the data processing unit according to the third embodiment of the present invention.

In FIG. 6, the memory address 1z corresponds to the waveform 8w in FIG. 5, the 8-bit memory data z in bit positions from 0 to 7 corresponds to the waveform 4w in FIG. 5, the 6-bit match count data (the number of matches) 3z in bit positions from 8 to 13 corresponds to the waveform 7w in FIG. 5, and the end flag 4z in the 14th bit position corresponds to the waveform 9w in FIG. 5.

In this way, in the data processing unit according to the third embodiment, the comparison instruction can be executed for any given value by setting desired comparison reference data in the first data register 5 functioning as a comparison reference data setting register, and can be terminated by the action of the number-of-retrievals counter 7 counting the number of retrievals performed within the comparison range, and the end flag signal 11 can thus be written to the second memory 4, so that the last written data can be detected by just reading the data written in the second memory 4.

As described above, since the number of times the comparison data matched, the data that did not match, and the end flag signal 11 are written to the second memory 4, and since the data in the second memory 4 can be read out (in the order in which the data were written) in each cycle at any later time, data processing such as variable length encoding can be performed without interruption. Furthermore, any data can be handled by setting any given value in the first data register 5, and the versatility is thus increased.

Further, by writing the number of times the comparison data matched, the data that did not match, and the end flag signal 11 to the second memory 4, a variable length encoding instruction can be executed any time without having to be limited to the time at which a count of the number of times the comparison data matched and the data that did not match, based on which variable length encoding is performed, are latched.

Furthermore, when the execution unit 2 is configured to have other functions than the detection of the number of values 0, since it has a path via which to store data in the second memory 4, the execution unit 2 of such a configuration can also be used without losing its versatility.

When generating data for variable length encoding using specialized circuitry, as in the prior art example, it is not possible to perform arithmetic operations other than those for the generation of data for variable length encoding; if other operations such as additions and comparisons in addition to the generation of data for variable length encoding are to be performed, it will become necessary to provide general-purpose circuitry such as an adder and comparator in addition to the specialized circuitry designed for the generation of data for variable length encoding, and the chip area of the integrated circuit will increase. On the other hand, in the present invention, since the circuitry provided for the generation of data for variable length encoding can be designed with versatility, other operations such as additions and comparisons can also be performed using the same circuitry. Accordingly, not only the processing for the generation of data for variable length encoding but also other processing can be performed without requiring increasing the chip area of the integrated circuit compared with the configuration designed exclusively for the generation of data for variable length encoding.

Furthermore, since the data before variable length encoding is held in the second memory 4, it is possible to verify whether or not the variable length encoded data has been correctly converted by comparing the variable length encoded data with the data held in the second memory 4, and the variable length encoded data can thus be debugged.

The last written data earlier mentioned refers to the data that was written at the last address when comparing data in the first memory 3, for example, from a certain address to a certain address. Upon detecting the last written data, the execution of the comparison instruction is terminated, and the end flag signal 11 is written to the second memory 4.

When performing processing for variable length encoding or the like, data written by the comparison instruction is read out, and by reading the last written data containing the end flag signal 11, the end of the data can be detected, thus making it possible to perform variable length encoding.

It will also be noted that the data processing unit is equally implementable if data from some other memory is input as the comparison reference data to the first data register 5. That is, in the above-described configuration, the data from the first memory 3 is compared with the value from the data register 5; this means that data from some other memory may be written to the data register 5 and the data from the first memory 5 may be compared with the value from that other memory.

Embodiment 4

Figure 8:
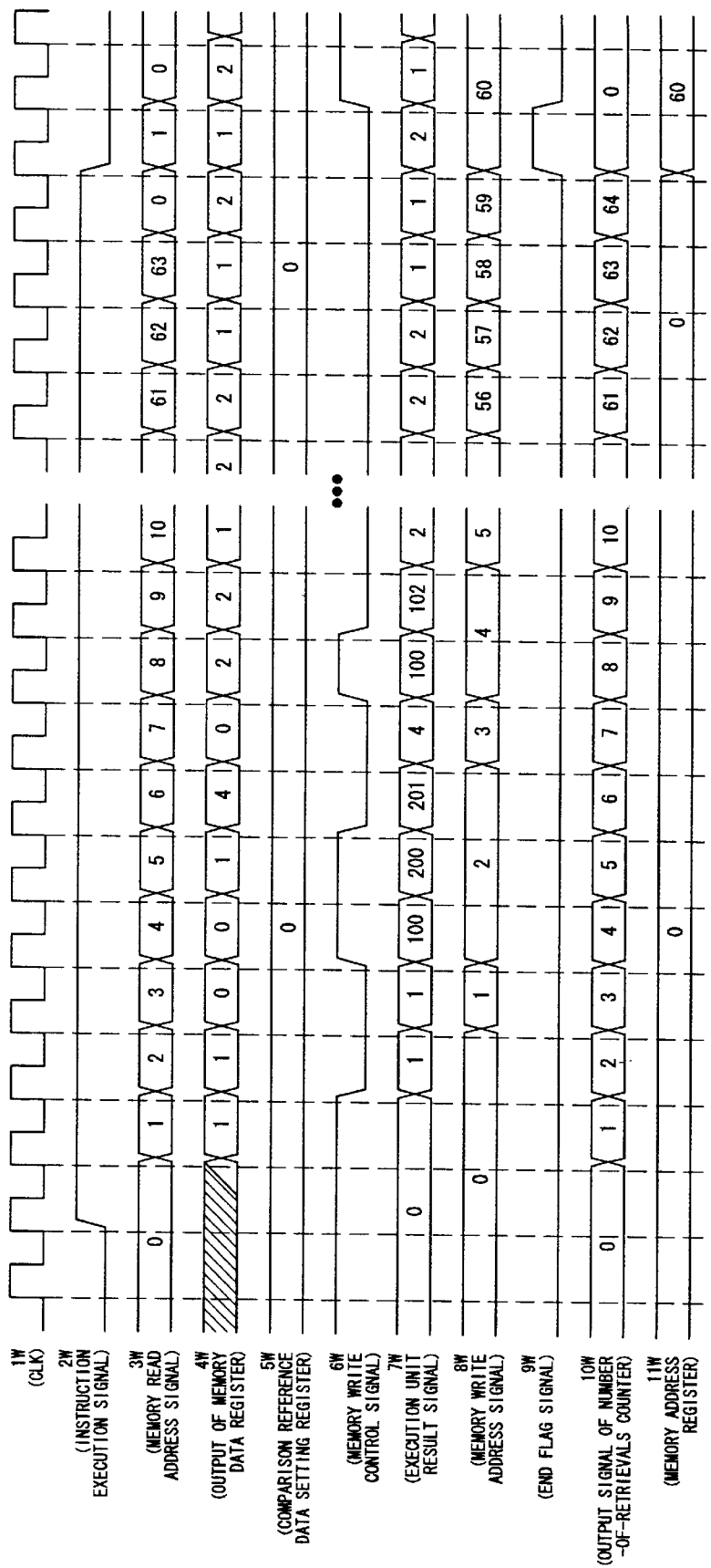
FIG. 8 is a diagram showing operating waveforms of the data processing unit according to the fourth embodiment of the present invention.

A data processing unit according to a fourth embodiment of the present invention will be described with reference to FIGS. 7 and 8.

FIG. 7 is a block diagram showing the configuration of the data processing unit according to the fourth embodiment of the present invention. In FIG. 7, reference character 4a is a second memory, and 19 is a third data register as a 6-bit memory address storage register.

In the data processing unit of the fourth embodiment, the control unit 1, execution unit 2, first memory 3, first data register 5, second data register 6, and number-of-retrievals counter 7 are essentially the same in configuration as the corresponding elements in the third embodiment shown in FIG. 4. Differences from the third embodiment are that the second memory 4a is a 14-bit-data memory with addresses 0 to 63, and that the third data register 19 as a memory address storage register is additionally provided. FIG. 8 is a diagram showing operating waveforms of the data processing unit according to the fourth embodiment of the present invention.

The operation of the thus configured data processing unit will be described below with reference to FIGS. 7 and 8.

Waveform 1w in FIG. 8 will be used as the operating clock (CLK) of the data processing unit of FIG. 7, and the data processing unit of FIG. 7 will be described as operating in synchronism with the rising edge of the operating clock 1w. The control unit 1 sets the instruction execution signal 8 (waveform 2w in FIG. 8) to the H level to execute the comparison instruction. The control unit 1 outputs the memory read control signal 10, in response to which the memory data signal 15 at the address specified by the memory read address signal (waveform 3w in FIG. 8) carried in the control signal 10 is read out of the first memory 3 and stored in the second data register 6 (waveform 4w in FIG. 8). Prior to the execution of the comparison instruction, comparison reference data is set in the first data register 5 by using the comparison reference data setting signal 9 (waveform 5w in FIG. 8; comparison reference data value is 0).

In response to the instruction execution signal 8 carrying the comparison instruction, the execution unit 2 compares the output signal 17 (waveform 4w in FIG. 8) of the second data register 6 with the output signal 16 (waveform 5w in FIG. 8) of the first data register 5 and, when they match, outputs the comparison signal 13 to the control unit 1, thereby setting the memory write control signal 12 (waveform 6w in FIG. 8), to be output from the control unit 1, to the H level to inhibit writing to the second memory 4a and count the number of consecutive matches. When they do not match, on the other hand, the execution unit 2 writes its result signal (waveform 7w in FIG. 8) as the execution data signal 18, together with the end flag signal 11 (waveform 9w in FIG. 8) , to the second memory 4a at the address (single address) specified by the memory write address signal (waveform 8w in FIG. 8) carried in the memory write control signal 12.

When the output signal 14 (waveform 10w in FIG. 8) of the number-of-retrievals counter 7 indicates 64, the control unit 1 stores the address then indicated by the memory write address signal (waveform 8w in FIG. 8) carried in the memory write control signal 12 into the third data register 19 (waveform 11w in FIG. 8), and sets the instruction execution signal 8 to the L level to terminate the comparison instruction, while, at the same time, setting the end flag signal 11 (waveform 9w in FIG. 8) to the H level.

In this way, in the data processing unit according to the fourth embodiment, the comparison instruction can be executed for any given value by setting desired comparison reference data in the first data register 5 functioning as a comparison reference data setting register, and can be terminated by the action of the number-of-retrievals counter 7 counting the number of retrievals performed within the comparison range, and the end flag signal 11 can thus be generated and the memory address at that time be stored in the third data register 19 functioning as a memory address setting register; accordingly, the memory address where the last written data is stored can be detected by just reading the data from the third data register 19.

As described above, since the number of times the comparison data matched and the data that did not match are written to the second memory 4a, and since the data in the second memory 4a can be read out in each cycle at any later time, data processing such as variable length encoding can be performed without interruption. Further, since the memory address where the last written data is stored is held in the third register 19 instead of writing the end flag signal to the second memory 4a, the bit count of the second memory 4a can be reduced. In the case of the foregoing third embodiment, an extra bit is required for the end flag (indicated by 4z in FIG. 6). In the fourth embodiment, on the other hand, the address where the last written data is stored can be found by reading the third register Furthermore, any data can be handled by setting any given value in the first data register 5, and the versatility is thus increased.

The other effects are the same as those described in the third embodiment.

It will also be recognized that the data processing unit is equally implementable if data from some other memory is input as the comparison reference data to the first data register 5.

Embodiment 5

A data processing unit according to a fifth embodiment of the present invention will be described with reference to FIGS. 9 and 10.

Figure 9:
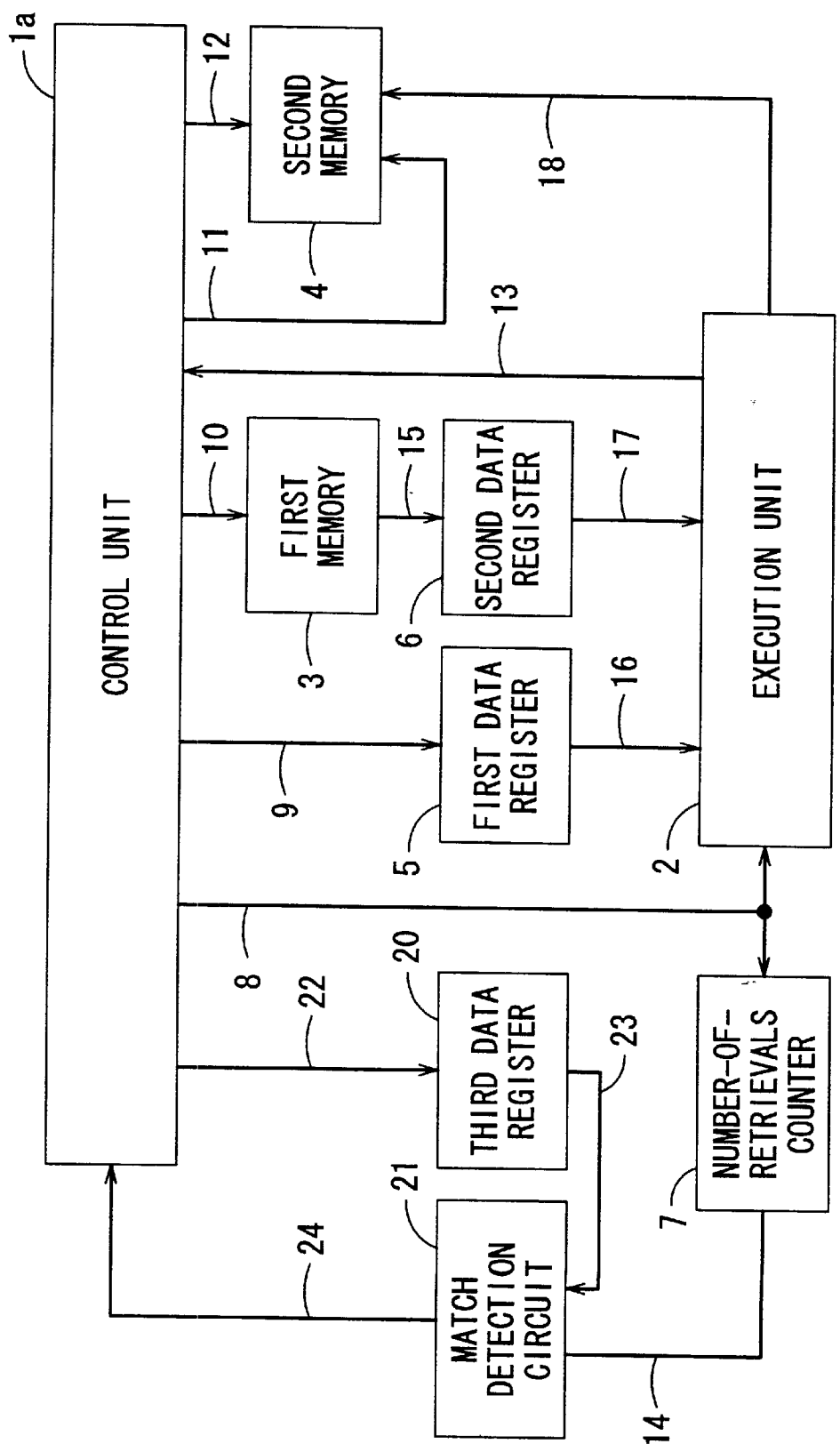
FIG. 9 is a block diagram showing the configuration of a data processing unit according to a fifth embodiment of the present invention.

FIG. 9 is a block diagram showing the configuration of the data processing unit according to the fifth embodiment of the present invention. In FIG. 9, reference character 1a is a control unit, 20 is a third data register as a 7-bit retrieval count number setting register, 21 is a match detection circuit, 22 is a retrieval count number setting signal, 23 is an output signal of the third data register 20, and 24 is a match detection signal.

In the data processing unit of the fifth embodiment, the execution unit 2, first memory 3, second memory 4, first data register 5, second data register 6, and number-of-retrievals counter 7 are essentially the same in configuration as the corresponding elements in the third embodiment shown in FIG. 4. Differences from the third embodiment are that the control unit 1a takes as an input the match detection signal 24, not the output signal 14 of the number-of-retrievals counter 7, that the control unit 1a additionally outputs the retrieval count number setting signal 22, and that the third data register 20 and match detection circuit 21 are additionally provided. FIG. 10 is a diagram showing operating waveforms of the data processing unit according to the fifth embodiment of the present invention.

The operation of the thus configured data processing unit will be described below with reference to FIGS. 9 and 10.

Waveform 1w in FIG. 10 will be used as the operating clock (CLK) of the data processing unit of FIG. 9, and the data processing unit of FIG. 9 will be described as operating in synchronism with the rising edge of the operating clock 1w. The control unit 1a sets the instruction execution signal 8 (waveform 2w in FIG. 10) to the H level to execute the comparison instruction. The control unit 1a outputs the memory read control signal 10, in response to which the memory data signal 15 at the address specified by the memory read address signal (waveform 3w in FIG. 10) carried in the control signal 10 is read out and stored in the second data register 6 (waveform 4w in FIG. 10). Prior to the execution of the comparison instruction, comparison reference data is set in the first data register 5 by using the comparison reference data setting signal 9 (waveform 5w in FIG. 10; comparison reference data value is 0), and a retrieval count number (an end value for the number of retrievals) is set in the third data register 20 by using the retrieval count number setting signal 22 (waveform 12w in FIG. 10; retrieval count number is 64).

In response to the comparison instruction execution signal 8, the execution unit 2 compares the output signal 17 (waveform 4w in FIG. 10) of the second data register 6 with the output signal 16 (waveform 5w in FIG. 10) of the first data register 5 and, when they match, outputs the comparison signal 13 to the control unit 1a, thereby setting the memory write control signal 12 (waveform 6w in FIG. 10), to be output from the control unit 1a, to the H level to inhibit writing to the second memory 4 and count the number of consecutive matches. When they do not match, on the other hand, the execution unit 2 writes its result signal (waveform 7w in FIG. 10) as the execution data signal 18, together with the end flag signal 11 (waveform 9w in FIG. 10) , to the second memory 4 at the address (single address) specified by the memory write address signal (waveform 8w in FIG. 10) carried in the memory write control signal 12.

Figure 10:
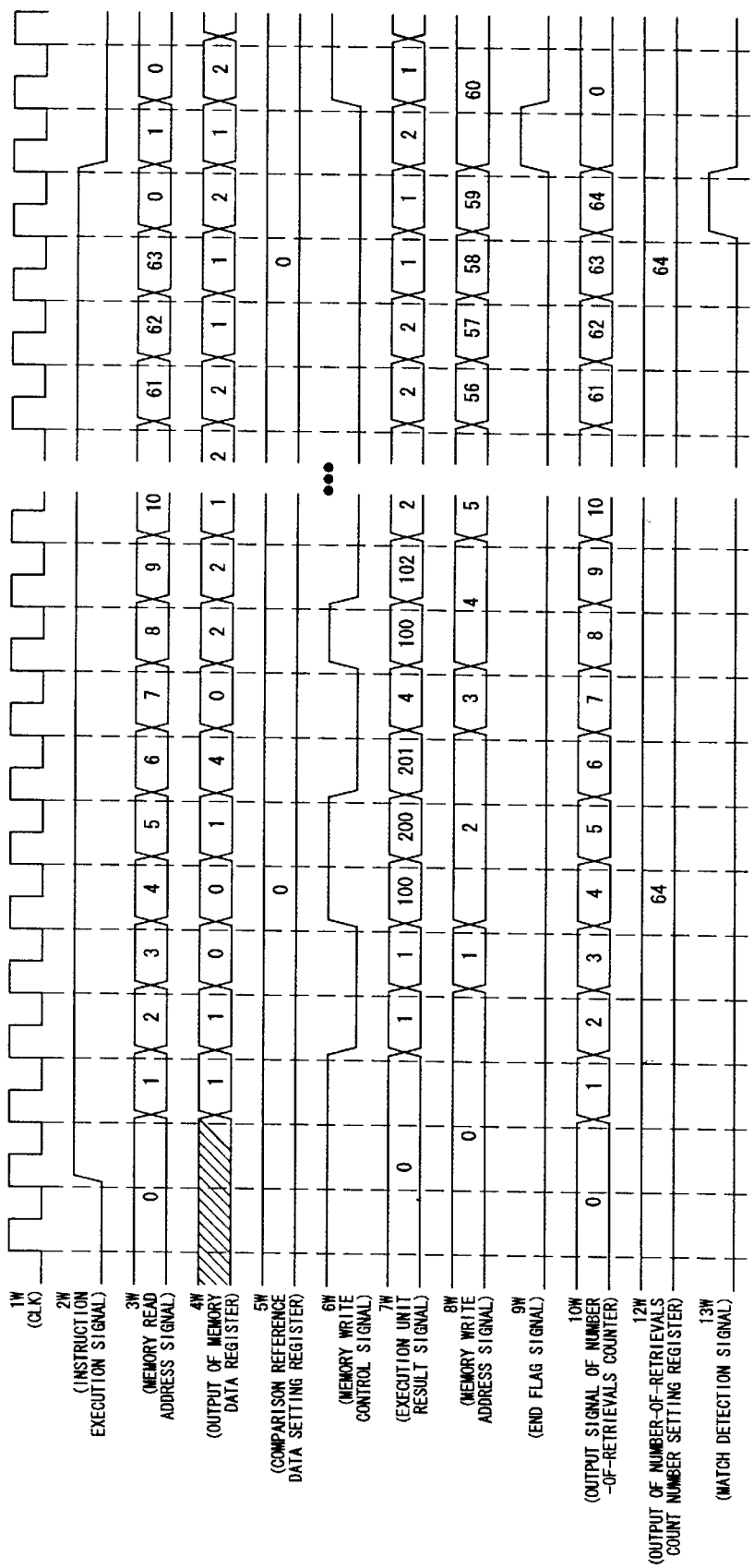
FIG. 10 is a diagram showing operating waveforms of the data processing unit according to the fifth embodiment of the present invention.

The match detection circuit 21 detects whether or not the output signal 14 (waveform 10w in FIG. 10) of the number-of-retrievals counter 7 matches with the output signal 23 of the third data register 20 and, when both output signals 14 and 23 indicate value 64, sets the match detection signal 24 to the H level for output (waveform 13w in FIG. 10). In response to the match detection signal 24, the control unit 1a sets the instruction execution signal 8 to the L level to terminate the comparison instruction, and at the same time, sets the end flag signal (waveform 9w in FIG. 10) to the H level.

In this way, the data processing unit of the fifth embodiment is capable of executing the comparison instruction for any given value by setting desired comparison reference data in the first data register 5 functioning as a comparison reference data setting register, and can arbitrarily set the number of retrievals, to be performed within the comparison range, in the third data register 20 functioning as a retrieval count number setting register, so that the comparison instruction can be terminated after performing an arbitrary number of retrievals. Since the end flag signal 11 can thus be written to the second memory 4, the last written data can be detected by just reading out the data written to the second memory 4.

As described above, since the number of times the comparison data matched, the data that did not match, and the end flag signal 11 are written to the second memory 4, and since the data in the second memory 4 can be read out (in the order in which the data were written) in each cycle at any later time, data processing such as variable length encoding can be performed without interruption. Furthermore, any data can be handled by setting desired values in the third data register 20 and the first data register 5, and the versatility is thus increased.

The other effects are the same as those described in the third embodiment.

It will also be recognized that the data processing unit is equally implementable if data from some other memory is input as the comparison reference data to the first data register 5.

Embodiment 6

A data processing unit according to a sixth embodiment of the present invention will be described with reference to FIGS. 11 to 13.

Figure 11:
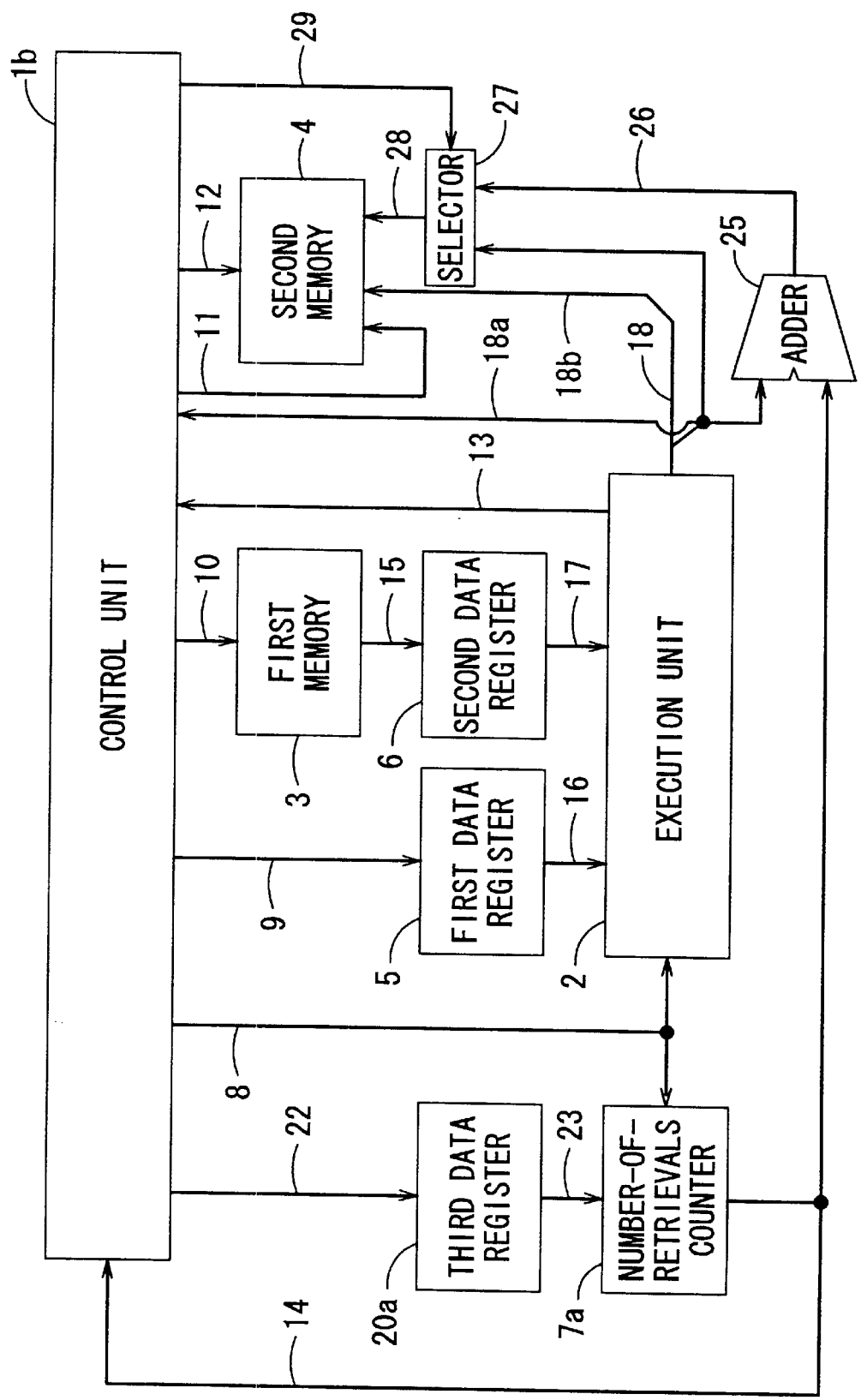
FIG. 11 is a block diagram showing the configuration of a data processing unit according to a sixth embodiment of the present invention.

FIG. 11 is a block diagram showing the configuration of the data processing unit according to the sixth embodiment of the present invention. In FIG. 11, reference character $1b$ is a control unit, $7a$ is a number-of-retrievals counter, 14 is an output signal of the number-of-retrievals counter $7a$, $18a$ is a number-of-matches data signal carried in the execution data signal 18, $18b$ is a nonmatching data signal, $20a$ is a third data register as a 6-bit retrieval count number setting register, 22 is a retrieval count number setting signal, 23 is an output signal of the third data register $20a$, 25 is an adder, 26 is an output signal of the adder 25, 27 is a selector, 28 is an output signal of the selector 27, and 29 is a selection signal for the selector 27.

In the data processing unit of the sixth embodiment, the execution unit 2, first memory 3, second memory 4, first data register 5, and second data register 6 are essentially the same in configuration as the corresponding elements in the fifth embodiment shown in FIG. 9. Differences from the fifth embodiment are that the control unit $1b$ takes as inputs the output signal 14 of the search number counter $7a$ and the number-of-matches data signal $18a$, that the control unit $1b$ additionally outputs the selection signal 29, that the bit count of the third data register $20a$ as a retrieval count number setting register is 6, that the output signal 23 of the third data register $20a$ is loaded into the number-of-retrievals counter $7a$ configured as a down counter, and that the adder 25 and selector 27 are additionally provided. Here, an initial value of the retrieval count number (number of retrievals) is stored in the third data register $20a$. FIG. 12 is a diagram showing operating waveforms of the data processing unit according to the sixth embodiment of the present invention, and FIG. 13 is a diagram showing the contents of the second memory 4 at the completion of writing, wherein reference character $1z$ indicates the memory address (in decimal), $2z$ the memory data, $3z$ the number of matches, and $4z$ the end flag. The memory data $2z$ is the data written without being shifted in the arithmetic unit of FIG. 1, and the number of matches, $3z$, is the data written after being shifted in the arithmetic unit of FIG. 1. Here, the position of the memory data $2z$ may be interchanged with the position of the number of matches, $3z$, depending on how the shifter in the arithmetic unit is set up.

The operation of the thus configured data processing unit will be described below with reference to FIGS. 11 to 13.

Waveform $1w$ in FIG. 12 will be used as the operating clock (CLK) of the data processing unit of FIG. 11, and the data processing unit of FIG. 11 will be described as operating in synchronism with the rising edge of the operating clock $1w$. The control unit $1b$ sets the instruction execution signal 8 (waveform $2w$ in FIG. 12) to the H level to execute the comparison instruction. The control unit $1b$ outputs the memory read control signal 10 (waveform $3w$ in FIG. 12), in response to which the memory data signal 15 at the specified address is read out and stored in the second data register 6 (waveform $4w$ in FIG. 12). Prior to the execution of the comparison instruction, comparison reference data is set in the first data register 5 by using the comparison reference data setting signal 9 (waveform $5w$ in FIG. 12; comparison reference data value is 0), and the retrieval count number (the initial value for the number of retrievals) is set in the third data register $20a$ by using the retrieval count number setting signal 22 (waveform $12w$ in FIG. 12; retrieval count number is 63).

In response to the comparison instruction execution signal 8, the execution unit 2 compares the output signal 17 (waveform $4w$ in FIG. 12) of the second data register 6 with the output signal 16 (waveform $5w$ in FIG. 12) of the first data register 5 and, when they match, outputs the comparison signal 13 to the control unit $1b$, thereby setting the memory write control signal 12 (waveform $6w$ in FIG. 12), to be output from the control unit $1b$, to the H level to inhibit writing to the second memory 4 and count the number of consecutive matches. When they do not match, on the other hand, the execution unit 2 writes its result signal (waveform $7w$ in FIG. 12) as the execution data signal 18 (nonmatching data signal $18b$ and number-of-matches data signal $18a$), together with the end flag signal 11 (waveform $9w$ in FIG. 12), to the second memory 4 at the address (single address) specified by the memory write address signal (waveform $8w$ in FIG. 12) carried in the memory write control signal 12.

The control unit $1b$ sets the initial value of the number-of-retrievals counter $7a$ (the output value of the third data register $20a$) by the instruction execution signal 8, and the counter $7a$ starts to count down; when the output signal 14 (waveform $10w$ in FIG. 12) of the number-of-retrievals-counter $7a$ becomes 0, the control unit $1b$ sets the instruction execution signal 8 to the L level to terminate the comparison instruction and, at the same time, sets the end flag signal 11 to the H level. Or, when the number of consecutive matches has reached a prescribed value (waveform $7w$ in FIG. 12; the value is 700 in the illustrated example), the selection signal 29 (waveform $14w$ in FIG. 12) is set to the H level, assuming th data in the remaining retrieval range also match the comparison reference data, and when the low order 8 bits of the number-of-retrievals counter output signal 14 ($10w$ in FIG. 12) and the execution unit result signal are all 0s, the high order 6 bits of the two signals are added together by the adder 25, and its output data 26 (waveform $15w$ in FIG. 12) is written to the second memory 4 instead of the number of matches, $18a$, whereupon the comparison instruction is terminated and the end flag signal 11 is set to the H level.

Figure 12:
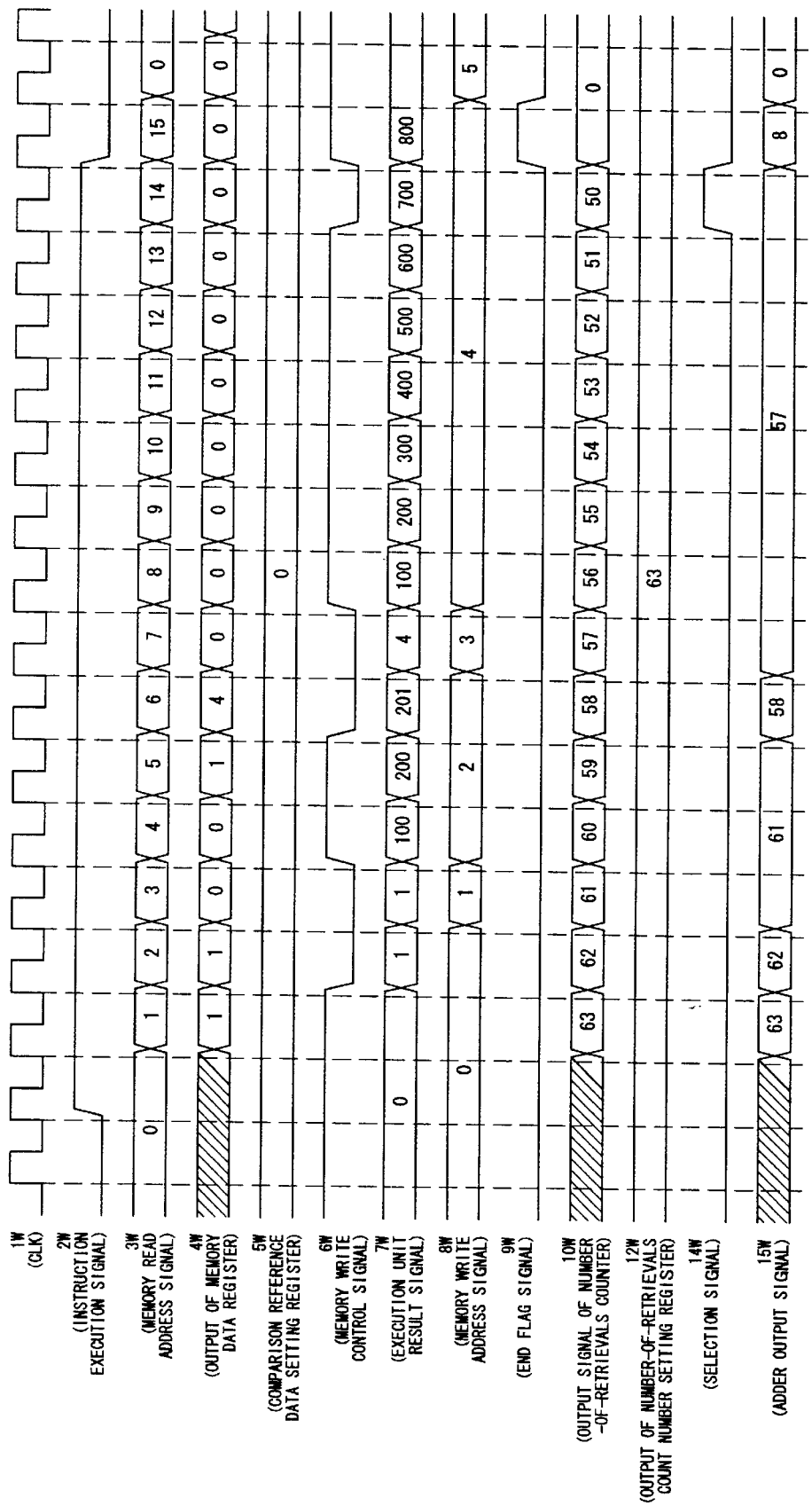
FIG. 12 is a diagram showing operating waveforms of the data processing unit according to the sixth embodiment of the present invention.
Figure 13:
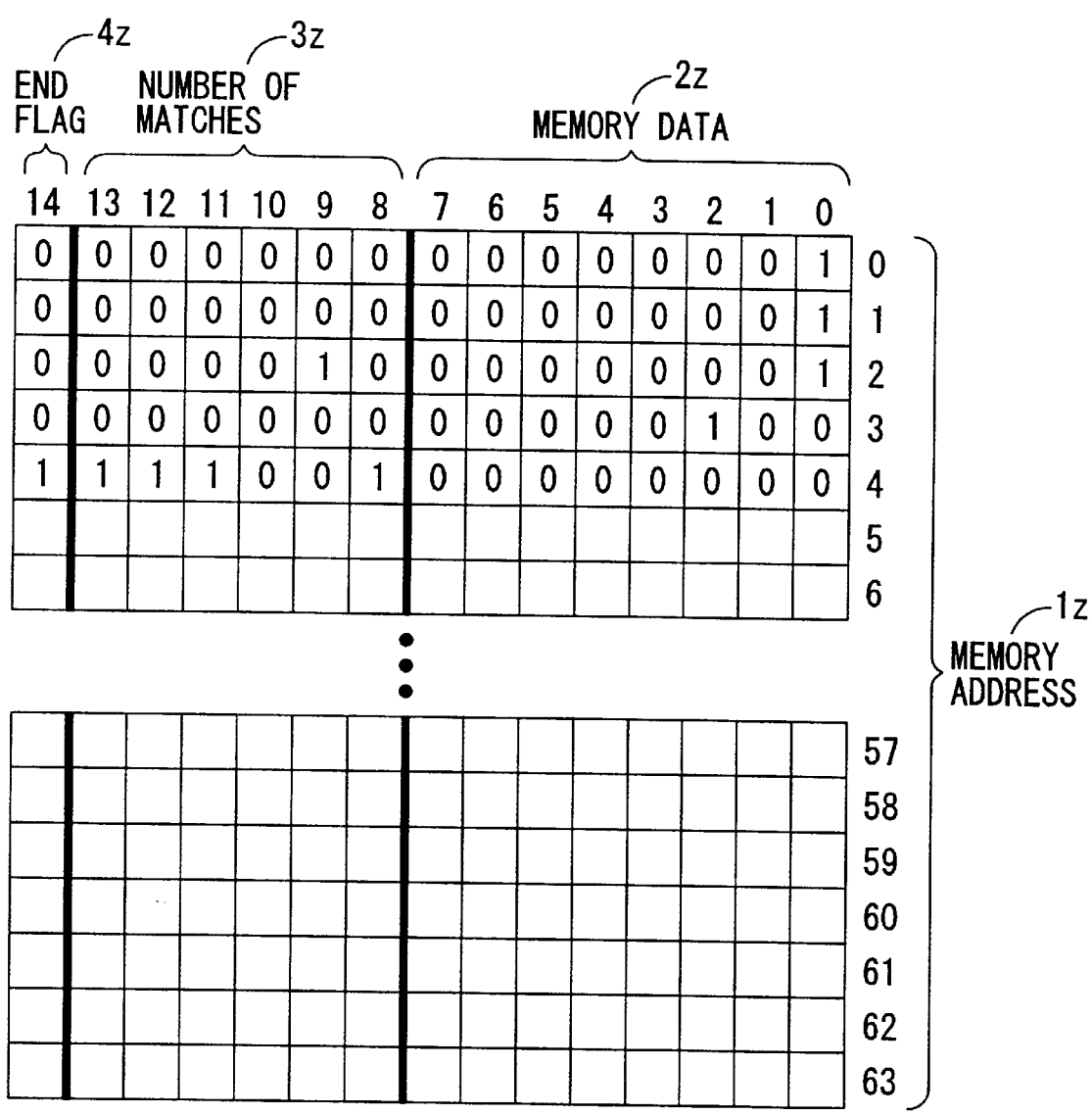
FIG. 13 is a diagram showing in simplified form the memory configuration at the completion of writing in the data processing unit according to the sixth embodiment of the present invention.

In FIG. 13, the memory address $1z$ corresponds to the waveform $8w$ in FIG. 12, the 8-bit memory data $2z$ in bit positions from 0 to 7 corresponds to the waveform $4w$ in FIG. 12, the 6-bit match count data (the number of matches) $3z$ in bit positions from 8 to 13 corresponds to the waveform $7w$ in FIG. 12, and the end flag $4z$ in the 14th bit position corresponds to the waveform $9w$ in FIG. 12.

In this way, the data processing unit of the sixth embodiment is capable of executing the comparison instruction for any given value by setting desired comparison reference data in the first data register 5 functioning as a comparison reference data setting register, and can arbitrarily set the number of retrievals, to be performed within the comparison range, in the third data register $20a$ functioning as a retrieval count number setting register, so that the comparison instruction can be terminated after performing an arbitrary number of retrievals. Furthermore, when data matches occur consecutively, the comparison instruction can be terminated by assuming that the remaining data also match the comparison reference data, thus shortening the entire retrieval time. Since the end flag signal 11 is thus written to the second memory 4, the last written data can be detected by just reading out the data written to the second memory 4.

As described above, since the number of times the comparison data matched, the data that did not match, and the end flag signal 11 are written to the second memory 4, and since the data in the second memory 4 can be read out (in the order in which the data were written) in each cycle at any later time, data processing such as variable length encoding can be performed without interruption. Furthermore, when data matches occur consecutively, the comparison instruction can be terminated by assuming that the remaining data also match the comparison reference data; this serves to shorten the entire retrieval time, hence shortening the processing time. Moreover, any data can be handled by setting desired values in the number-of-retrievals counter 7a and the first data register 5, and the versatility is thus increased.

The other effects are the same as those described in the third embodiment.

It will also be recognized that the data processing unit is equally implementable if data from some other memory is input as the comparison reference data to the first data register 5.

Embodiment 7

A data processing unit according to a seventh embodiment of the present invention will be described with reference to FIGS. 14 and 15.

Figure 14:
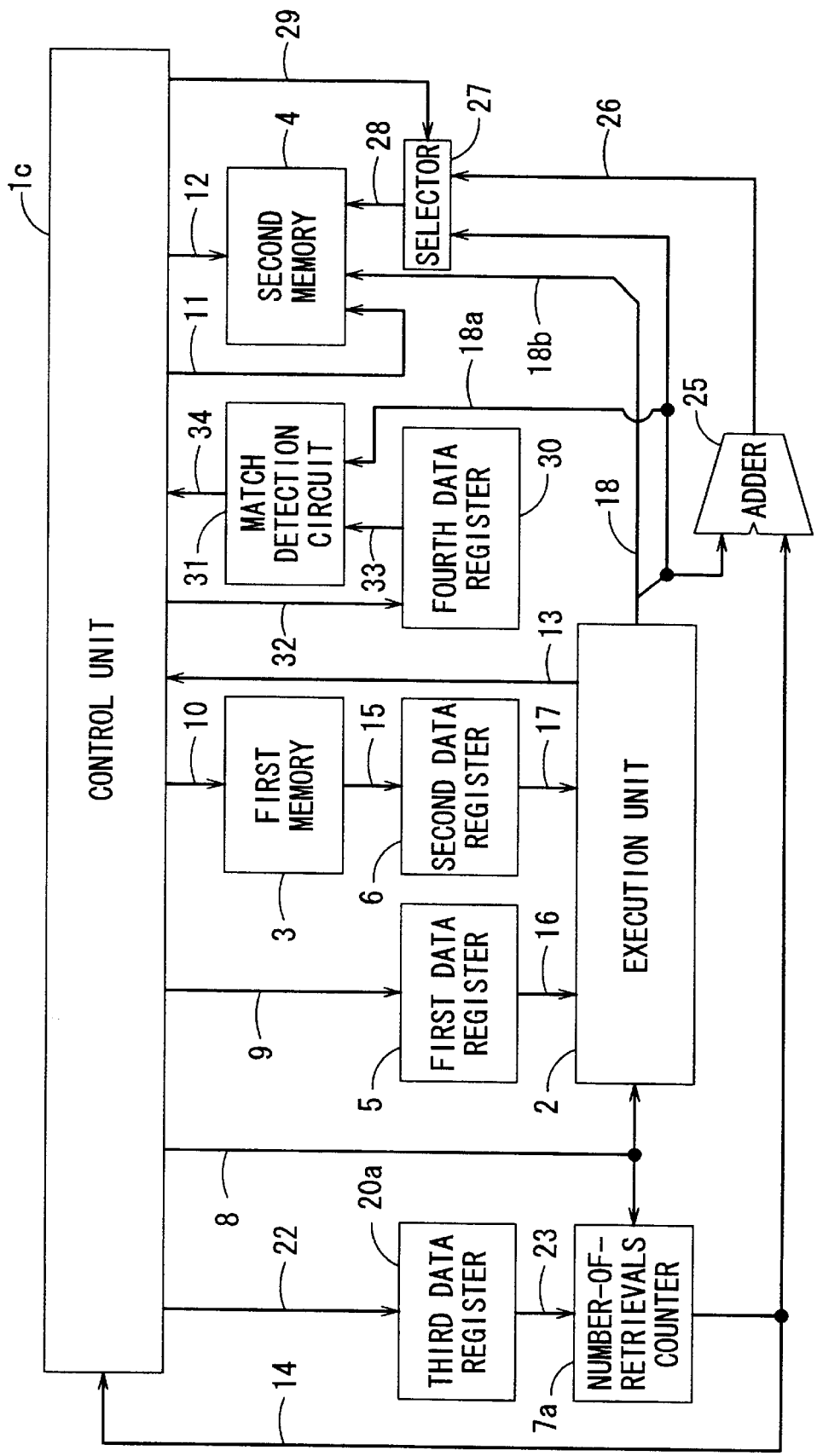
FIG. 14 is a block diagram showing the configuration of a data processing unit according to a seventh embodiment of the present invention.

FIG. 14 is a block diagram showing the configuration of the data processing unit according to the seventh embodiment of the present invention. In FIG. 14, reference character 1c is a control unit, 30 is a fourth data register as a number-of-matches setting register, 31 is a match detection circuit, 32 is a number-of-consecutive-matches setting signal, 33 is an output signal of the fourth data register 30, and 34 is a match detection signal.

In the data processing unit of the seventh embodiment, the execution unit 2, first memory 3, second memory 4, first data register 5, second data register 6, third data register 20a, adder 25, and selector 27 are essentially the same in configuration as the corresponding elements in the sixth embodiment shown in FIG. 11. Differences from the sixth embodiment are that the control unit Ic takes as an input the match detection signal 34 instead of the number-of-matches data signal 18a, that the control unit Ic additionally outputs the number-of-consecutive-matches setting signal 32, and that the fourth data register 30 as a number-of-matches setting register and the match detection circuit 31 are additionally provided. FIG. 15 is a diagram showing operating waveforms of the data processing unit according to the seventh embodiment of the present invention.

The operation of the thus configured data processing unit will be described below with reference to FIGS. 14 and 15.

Waveform 1w in FIG. 15 will be used as the operating clock (CLK) of the data processing unit of FIG. 14, and the data processing unit of FIG. 14 will be described as operating in synchronism with the rising edge of the operating clock 1w. The control unit 1c sets the instruction execution signal 8 (waveform 2w in FIG. 15) to the H level to execute the comparison instruction. The control unit 1c outputs the memory read control signal 10 (waveform 3w in FIG. 15), in response to which the memory data signal 15 at the specified address is read out and stored in the second data register 6 (waveform 4w in FIG. 15). Prior to the execution of the comparison instruction, comparison reference data is set in the first data register 5 by using the comparison reference data setting signal 9 (waveform 5w in FIG. 15; comparison reference data value is 0), the retrieval count number (the initial value for the number of retrievals) is set in the third data register 20a by using the retrieval count number setting signal 22 (waveform 12w in FIG. 15; retrieval count number is 63), and the number of matches (waveform 16w; the number of matches is 7) is set in the fourth data register 30 by using the number-of-consecutive-matches setting signal 32.

Figure 15:
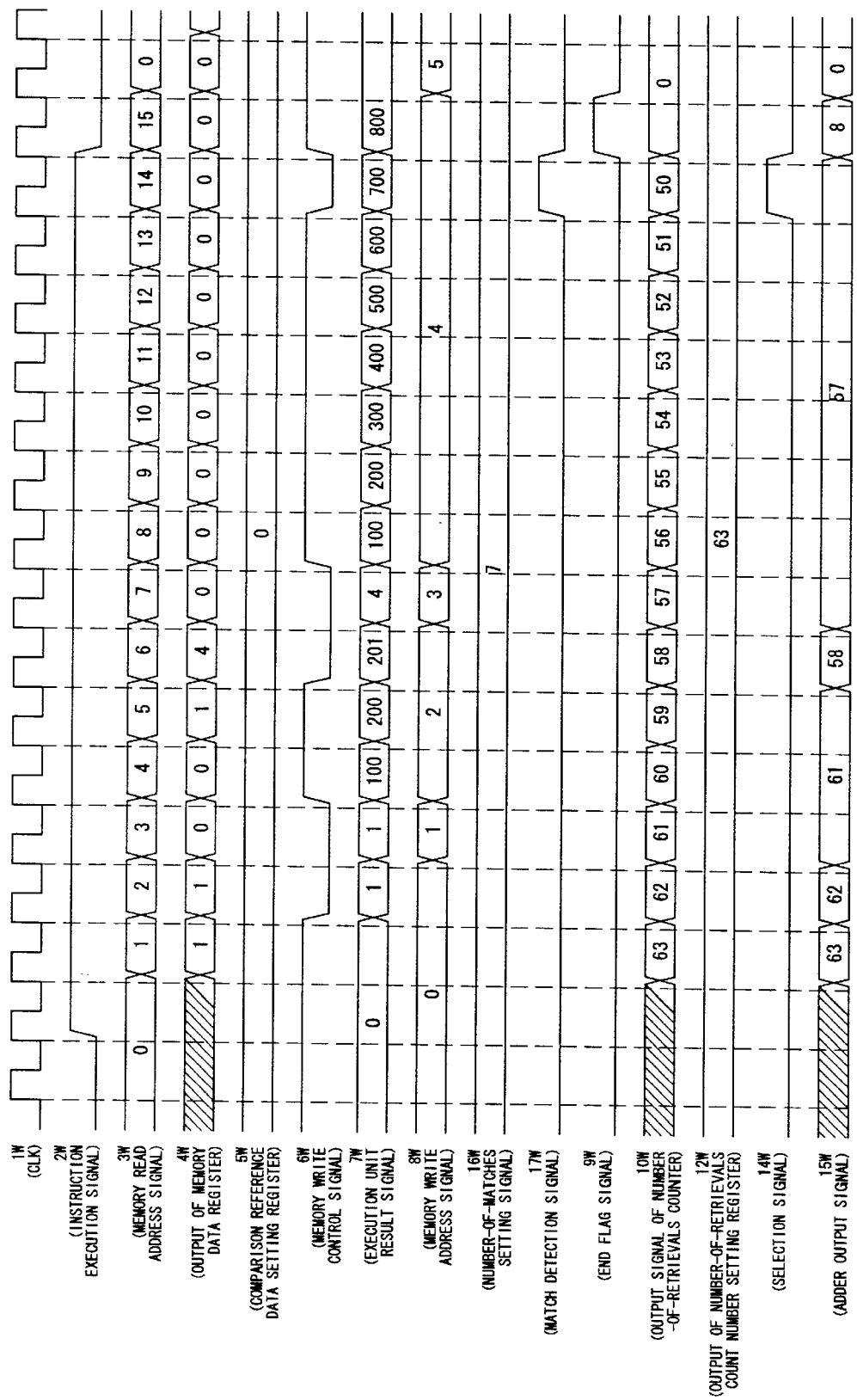
FIG. 15 is a diagram showing operating waveforms of the data processing unit according to the seventh embodiment of the present invention.
Figure 16:
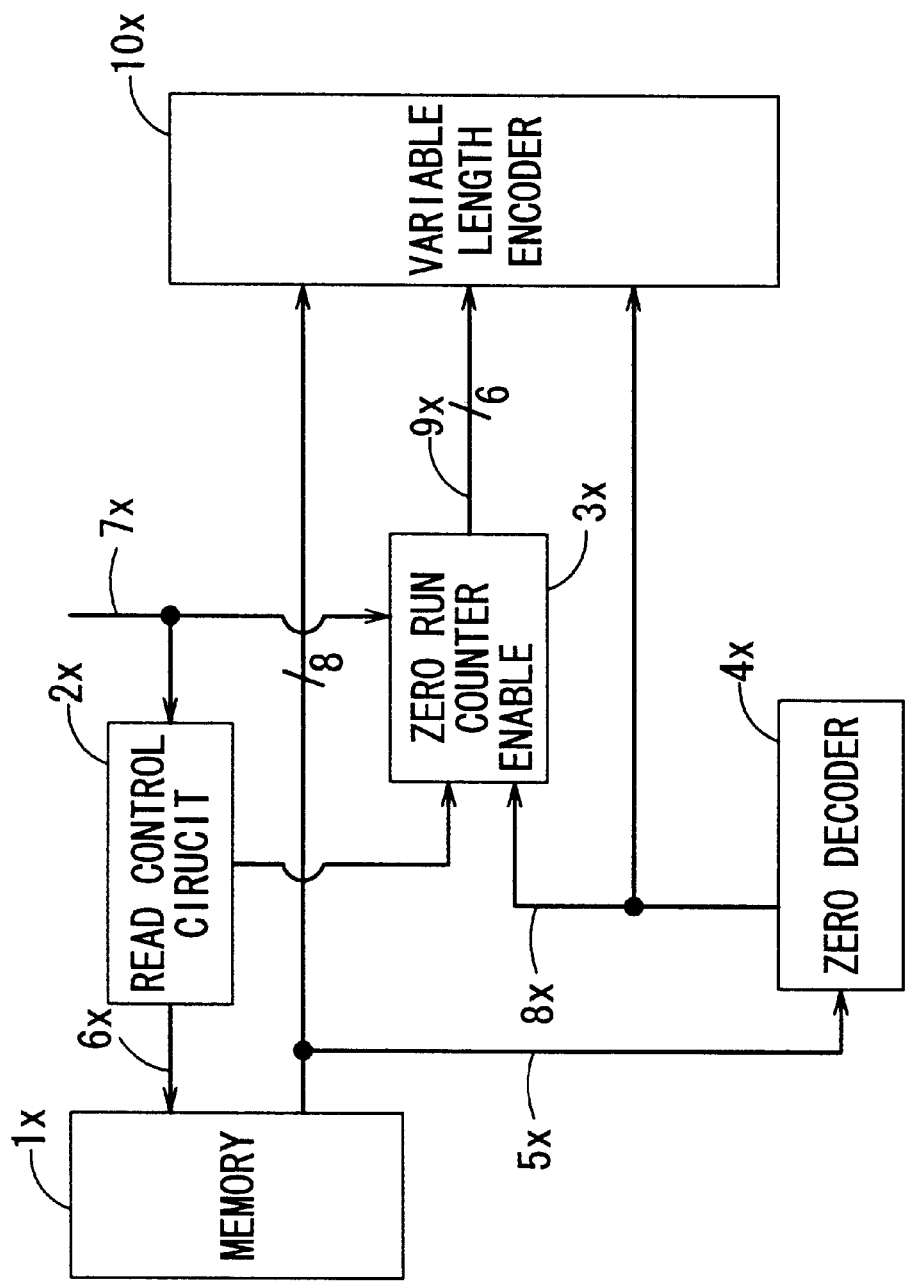
FIG. 16 is a block diagram showing the configuration of a prior art data processing unit.
Figure 17:
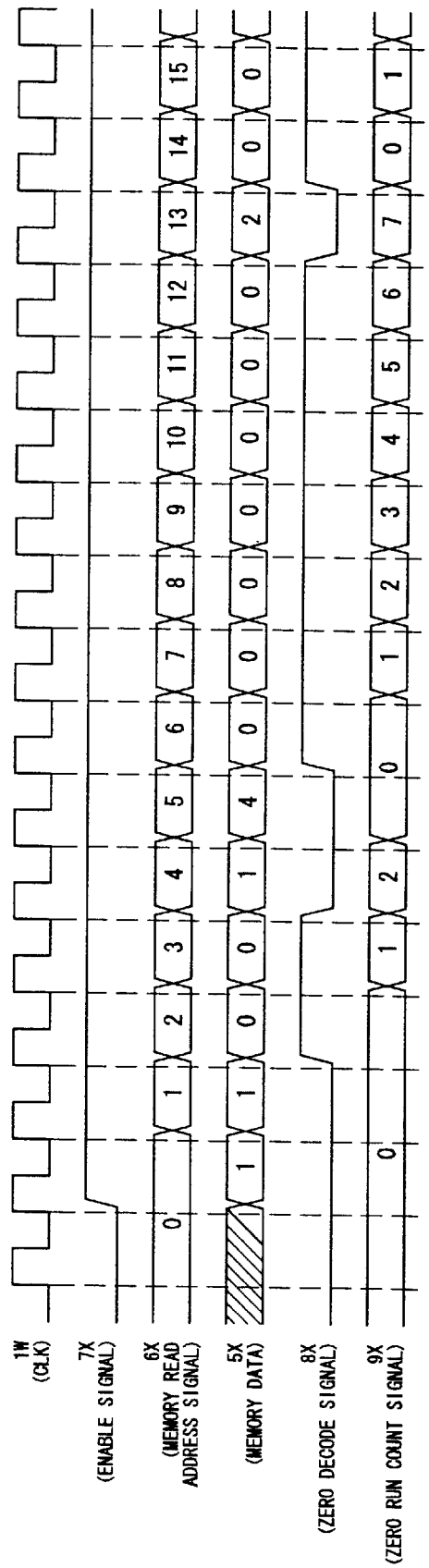
FIG. 17 is a diagram showing operating waveforms of the prior art data processing unit.

In response to the comparison instruction execution signal 8, the execution unit 2 compares the output signal 17 (waveform 4w in FIG. 15) of the second data register 6 with the output signal 16 (waveform 5w in FIG. 15) of the first data register 5 and, when they match, outputs the comparison signal 13 to the control unit 1c, thereby setting the memory write control signal 12 (waveform 6w in FIG. 15), to be output from the control unit 1c, to the H level to inhibit writing to the second memory 4 and count the number of consecutive matches (waveform 7w in FIG. 15). When they do not match, on the other hand, the execution unit 2 writes its result signal (waveform 7w in FIG. 15) as the execution data signal 18 (nonmatching data signal 18b and number-of-matches data signal 18a), together with the end flag signal 11 (waveform 9w in FIG. 15), to the second memory 4 at the address (single address) specified by the memory write address signal (waveform 8w in FIG. 15) carried in the memory write control signal 12.

The control unit 1c sets the initial value of the number-of-retrievals counter 7a (the output value of the third data register 20a) by the instruction execution signal 8, and the counter 7a starts to count down; when the output signal 14 of the number-of-retrievals counter 7a becomes 0, the control unit 1c sets the instruction execution signal 8 to the L level to terminate the comparison instruction and, at the same time, sets the end flag signal 11 to the H level; or, when the number of consecutive matches becomes equal to the value set in the fourth data register 30, and the match detection signal goes to the H level (waveform 17w in FIG. 15; the value is 700 in the illustrated example), the selection signal 29 (waveform 14w in FIG. 15) is set to the H level, assuming that the data in the remaining retrieval range also match the comparison reference data, and when the low order 8 bits of the output signal 14 of the number-of-retrievals counter 7a and the execution unit result signal are all 0s, the high order 6 bits of the two signals are added together by the adder 25, and its output data 26 (waveform 15w in FIG. 15) is written to the second memory 4 instead of the number of matches, 18a, whereupon the comparison instruction is terminated and the end flag signal 11 is set to the H level.

In this way, the data processing unit of the seventh embodiment is capable of executing the comparison instruction for any given value by setting desired comparison reference data in the first data register 5 functioning as a comparison reference data setting register, and can arbitrarily set the number of retrievals, to be performed within the comparison range, in the third data register 20a functioning as a retrieval count number setting register, so that the comparison instruction can be terminated after performing an arbitrary number of retrievals. Furthermore, by presetting the desired number of matches in the fourth data register 30 functioning as a number-of-matches setting register, when data matches occur consecutively the preset number of times, the comparison instruction can be terminated by assuming that the remaining data also match the comparison reference data, thus shortening the entire retrieval time. Since the end flag signal 11 is thus written to the second memory 4, the last written data can be detected by just reading out the data written to the second memory 4.

As described above, since the number of times the comparison data matched, the data that did not match, and the end flag signal 11 are written to the second memory 4, and since the data in the second memory 4 can be read out (in the order in which the data were written) in each cycle at any later time, data processing such as variable length encoding can be performed without interruption. Furthermore, by presetting the desired number of matches in the fourth data register 30, when data matches occur consecutively the preset number of times, the comparison instruction can be terminated by assuming that the remaining data also match the comparison reference data, thus making it possible to shorten the entire retrieval time and hence the processing time. Moreover, any data can be handled by setting desired values in the number-of-retrievals counter 7a and the first data register 5, and the versatility is thus increased.

The other effects are the same as those described in the third embodiment.

It will also be recognized that the data processing unit is equally implementable if data from some other memory is input as the comparison data to the first data register 5.

What is claimed is:

1. An arithmetic unit comprising: a comparator circuit which takes as inputs first data as comparison reference data and second data as data to be compared with said first data, and performs a comparison between said first and said second data, and which, when said first and said second data match as the result of said comparison, outputs a value 1 and sets a match signal active, and when said first and said second data do not match, outputs said second data and sets said match signal inactive; a shifter to which an output of said comparator circuit is input, and which shifts, or does not shift, the output of said comparator circuit, depending on the state of said match signal supplied from said comparator circuit; an adder circuit which accepts an output of said shifter at one input thereof; a register to which an output of said adder circuit is input; and a selection circuit which accepts a value 0 at one input thereof and an output of said register at the other input, and which couples one or the other of said inputs to the other input of said adder circuit in accordance with a selection signal, and wherein:

with said selection circuit selecting either said value 0 or the output of said register in accordance with said selection signal, when said first and said second data do not match, said second data that does not match said first data is output by being paired with a count of the number of times that said second data matched said first data since the last occurrence of a mismatch between said first and said second data.

2. An arithmetic unit comprising: a comparator circuit which takes as inputs first data as comparison reference data and second data as data to be compared with said first data, and performs a comparison between said first and said second data, and which, when said first and said second data match as the result of said comparison, outputs a value 1 and sets a match signal active, and when said first and said second data do not match, outputs said second data and sets said match signal inactive; a flag register to which said match signal is input; a first register to which an output of said comparator circuit is input; a shifter to which an output of said first register is input, and which shifts, or does not shift, the output of said first register, depending on the state of said match signal supplied from said flag register; a second register to which an output of said shifter is input; an adder circuit which accepts an output of said second register at one input thereof; a third register to which an output of said adder circuit is input; and a selection circuit which accepts a value 0 at one input thereof and an output of said third register at the other input, and which couples one or the other of said inputs to the other input of said adder circuit in accordance with a selection signal, and wherein:

with said selection circuit selecting either said value 0 or the output of said third register in accordance with said selection signal, when said first and said second data do not match, said second data that does not match said first data is output by being paired with a count of the number of times that said second data matched said first data since the last occurrence of a mismatch between said first and said second data.

\* \* \* \* \*